(12) United States Patent
Cha et al.

(10) Patent No.: US 10,586,584 B2
(45) Date of Patent: Mar. 10, 2020

(54) SEMICONDUCTOR SEMICONDUCTOR MEMORY DEVICES, MEMORY SYSTEMS AND METHODS OF OPERATING MEMORY DEVICES

(71) Applicant: Samsung Electronics Co., Ltd., Suwon-si (KR)

(72) Inventors: Sang-Uhn Cha, Suwon-si (KR); Hyun-Gi Kim, Anyang-si (KR); Hoon Sin, Hwaseong-si (KR); Ye-Sin Ryu, Seoul (KR); In-Woo Jun, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 16/228,518

(22) Filed: Dec. 20, 2018

(65) Prior Publication Data

US 2019/0371391 A1     Dec. 5, 2019

(30) Foreign Application Priority Data

Jun. 1, 2018   (KR) .................. 10-2018-0063278

(51) Int. Cl.
  *G11C 7/00*       (2006.01)
  *G11C 11/406*    (2006.01)
  *G06F 11/10*     (2006.01)

(52) U.S. Cl.
  CPC ...... *G11C 11/40618* (2013.01); *G06F 11/106* (2013.01); *G06F 11/1016* (2013.01); *G06F 11/1044* (2013.01); *G06F 11/1076* (2013.01); *G11C 11/40607* (2013.01)

(58) Field of Classification Search
  CPC ............ G11C 11/406; G11C 11/40615; G11C 2211/406; G11C 11/40618; G11C 2211/4067
  USPC .................................. 365/222, 221
  See application file for complete search history.

(56) References Cited

U.S. PATENT DOCUMENTS

| | | | |
|---|---|---|---|
| 4,758,992 | A | 7/1988 | Taguchi |
| 7,275,130 | B2 | 9/2007 | Klein |
| 8,621,324 | B2 | 12/2013 | Suh |
| 9,053,813 | B2 | 6/2015 | Kang et al. |
| 9,600,362 | B2 * | 3/2017 | Kang ................ G11C 11/40611 |
| 2007/0022244 | A1 | 1/2007 | Kimmery |

(Continued)

*Primary Examiner* — Son T Dinh
(74) *Attorney, Agent, or Firm* — Muir Patent Law, PLLC

(57) ABSTRACT

A semiconductor memory device includes a memory cell array, an error correction code (ECC) engine, a refresh control circuit, a scrubbing control circuit and a control logic circuit. The refresh control circuit generates refresh row addresses for refreshing a memory region on memory cell rows in response to a first command received from a memory controller. The scrubbing control circuit counts the refresh row addresses and generates a scrubbing address for performing a scrubbing operation on a first memory cell row of the memory cell rows whenever the scrubbing control circuit counts N refresh row addresses of the refresh row addresses. The ECC engine reads first data corresponding to a first codeword, from at least one sub-page in the first memory cell row, corrects at least one error bit in the first codeword and writes back the corrected first codeword in a corresponding memory location.

20 Claims, 20 Drawing Sheets

(56) References Cited

U.S. PATENT DOCUMENTS

2012/0099389 A1* 4/2012 Park ................. G11C 11/40618
365/200
2017/0255383 A1  9/2017 Chang et al.
2018/0150350 A1  5/2018 Cha et al.

* cited by examiner

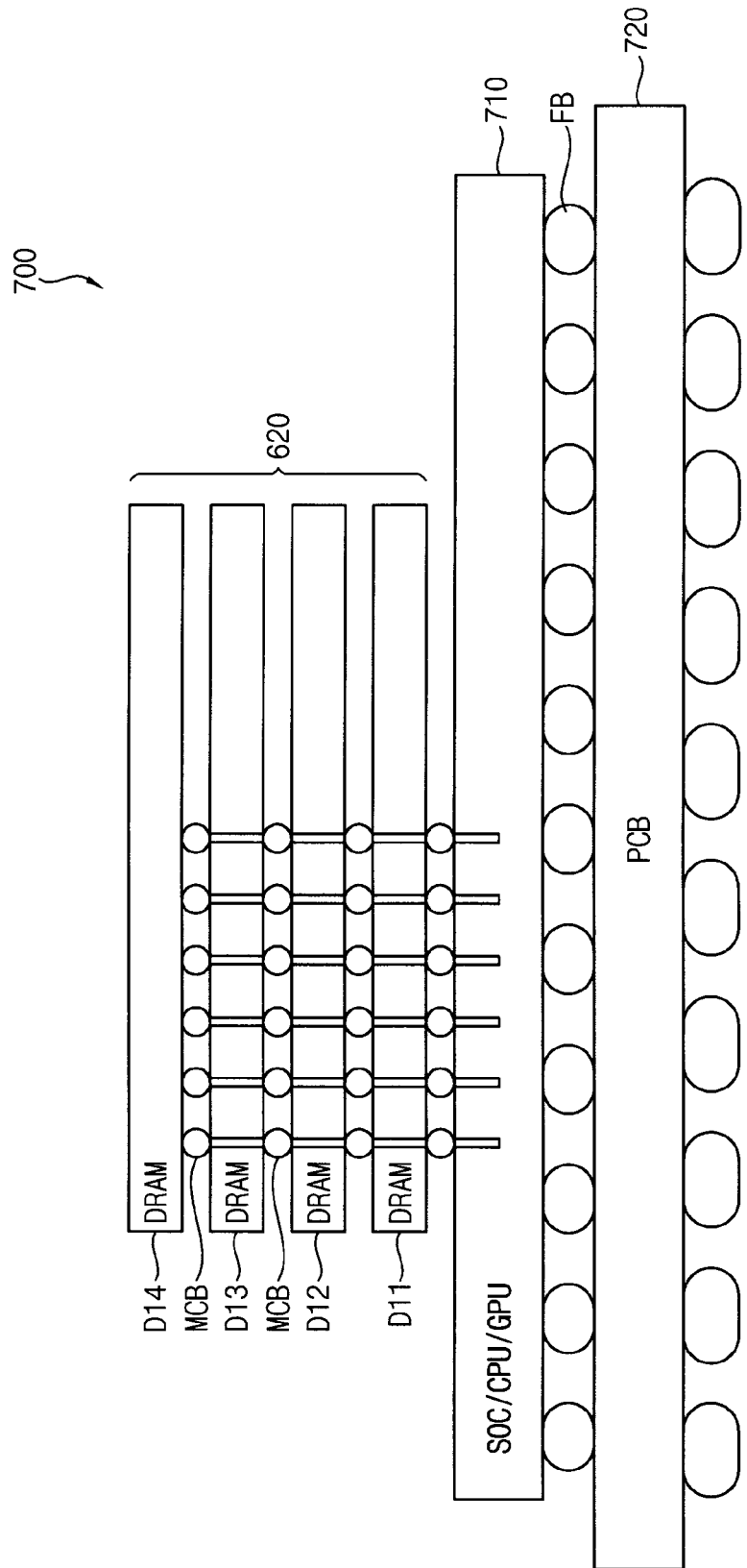

SEMICONDUCTOR SEMICONDUCTOR MEMORY DEVICES, MEMORY SYSTEMS AND METHODS OF OPERATING MEMORY DEVICES

CROSS-REFERENCE TO RELATED APPLICATIONS

This application claims the benefit of priority under 35 USC § 119 to Korean Patent Application No. 10-2018-0063278, filed on Jun. 1, 2018, in the Korean Intellectual Property Office, the disclosure of which is incorporated by reference in its entirety herein.

BACKGROUND

The present disclosure relates to memories, and more particularly to semiconductor memory devices, memory systems and methods of operating semiconductor memory devices.

Semiconductor memory devices may be classified into non-volatile memory devices such as flash memory devices and volatile memory devices such as DRAMs. High speed operation and cost efficiency of DRAMs make it possible for DRAMs to be used for system memories. Due to the continuing shrink in fabrication design rule of DRAMs, bit errors of memory cells in the DRAMs may rapidly increase and yield of the DRAMs may decrease. Therefore, there is a need for credibility of the semiconductor memory device.

SUMMARY

According to example embodiments, a semiconductor memory device includes a memory cell array, an error correction code (ECC) engine, a refresh control circuit, a scrubbing control circuit and a control logic circuit. The memory cell array includes a plurality of memory cell rows, and each of the plurality of memory cell rows includes memory cells. The refresh control circuit is configured to generate refresh row addresses for refreshing a memory region on the memory cell rows in response to a first command received from an external memory controller. The scrubbing control circuit is configured to count the refresh row addresses and generate a scrubbing address for performing a scrubbing operation on at least one sub-page in a first memory cell row of the memory cell rows whenever the scrubbing control circuit counts N refresh row addresses of the refresh row addresses. N is a natural number greater than one. The first memory cell row is selected in response to the scrubbing address. The control logic circuit is configured to control the ECC engine and the scrubbing control circuit, based on an access address and a command received from the memory controller. The control logic circuit is configured to control the ECC engine such that the ECC engine reads first data corresponding to a first codeword, from the at least one sub-page in the first memory cell row, corrects at least one error bit in the first codeword and writes back the corrected first codeword in a memory location in which the first data are stored.

According to example embodiments, a memory system includes a semiconductor memory device and a memory controller that controls the semiconductor memory device. The semiconductor memory device includes a memory cell array, an error correction code (ECC) engine, a refresh control circuit, a scrubbing control circuit and a control logic circuit. The memory cell array includes a plurality of memory cell rows, and each of the plurality of memory cell rows includes memory cells. The refresh control circuit is configured to generate refresh row addresses for refreshing a memory region on the memory cell rows in response to a first command received from the memory controller. The scrubbing control circuit is configured to count the refresh row addresses and generate a scrubbing address for performing a scrubbing operation on at least one sub-page in a first memory cell row of the memory cell rows whenever the scrubbing control circuit counts N refresh row addresses of the refresh row addresses. N is a natural number greater than one. The first memory cell row is selected in response to the scrubbing address. The control logic circuit is configured to control the ECC engine and the scrubbing control circuit, based on an access address and a command received from the memory controller. The control logic circuit is configured to control the ECC engine such that the ECC engine reads first data corresponding to a first codeword, from the at least one sub-page in the first memory cell row, corrects at least one error bit in the first codeword and writes back the corrected first codeword in a memory location in which the first data are stored.

According to example embodiments, in a method of operating a semiconductor memory device including a memory cell array that includes a plurality of memory cell rows and each of the plurality of memory cell rows including a plurality of memory cells, first internal addresses are generated sequentially in response to a first command received from an external memory controller, row operations are performed sequentially on the memory cell rows based on the first internal addresses and M column operations are performed on a first memory cell row from the memory cell rows. The selected memory cell row is selected from the from the memory cell rows based on a second internal address which is generated in the semiconductor memory device, whenever the row operations are performed N times on the memory cell rows. N is a natural number greater than one and M is a natural number equal to or greater than one.

Accordingly, the semiconductor memory device includes an ECC engine, a scrubbing control circuit and a refresh control circuit. The ECC engine and the scrubbing control circuit are configured to perform scrubbing operations on one codeword in a memory cell row designated by a scrubbing address provided from the scrubbing control circuit whenever the refresh control circuit performs refresh operation on the memory cell rows N times. In the scrubbing operation, the ECC engine corrects an error bit in one codeword and writes back the corrected codeword in a corresponding memory location. Therefore, the semiconductor memory device may enhance credibility and performance by preventing error bits from being accumulated.

BRIEF DESCRIPTION OF THE DRAWINGS

Example embodiments will be described below in more detail with reference to the accompanying drawings.

FIG. 24 shows a 3D chip structure in which a host and an HBM are directly connected without an interposer layer.

DETAILED DESCRIPTION

Various example embodiments will be described more fully hereinafter with reference to the accompanying drawings, in which example embodiments are shown.

Figure 1:
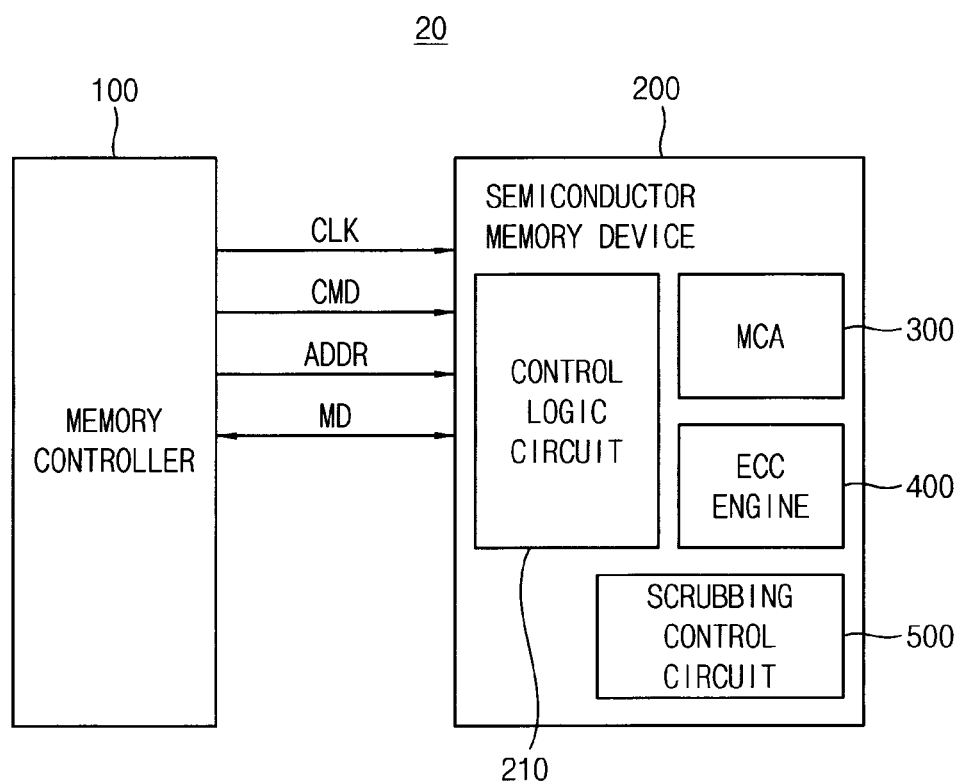
FIG. 1 is a block diagram illustrating a memory system according to example embodiments.

FIG. 1 is a block diagram illustrating a memory system according to example embodiments.

Referring to FIG. 1, a memory system 20 may include a memory controller 100 and a semiconductor memory device 200.

The memory controller 100 may control overall operation of the memory system 20. The memory controller 100 may control overall data exchange between an external host and the semiconductor memory device 200. For example, the memory controller 100 may write data in the semiconductor memory device 200 or read data from the semiconductor memory device 200 in response to request from the host.

In addition, the memory controller 100 may issue operation commands to the semiconductor memory device 200 for controlling the semiconductor memory device 200.

In some example embodiments, the semiconductor memory device 200 is a memory device including dynamic memory cells such as a dynamic random access memory (DRAM), double data rate 4 (DDR4) synchronous DRAM (SDRAM), a low power DDR4 (LPDDR4) SDRAM, or a LPDDR5 SDRAM.

The memory controller 100 transmits a clock signal CLK, a command CMD, and an address (signal) ADDR to the semiconductor memory device 200 and exchanges main data MD with the semiconductor memory device 200.

The semiconductor memory device 200 includes a memory cell array 300 that stores the main data MD and parity bits, an error correction code (ECC) engine 400, a control logic circuit 210 and a scrubbing control circuit 500.

The ECC engine 400 may perform ECC encoding on a write data to be stored in a target page of the memory cell array 300, and may perform ECC decoding or decoding on a codeword read from the target page under control of the control logic circuit 210.

The scrubbing control circuit 500 may generate scrubbing addresses such that a scrubbing operation is performed on a selected memory cell row of a plurality of memory cell rows whenever refresh operation is performed on M memory cell rows when the refresh operation is performed on the plurality of memory cell rows included in the memory cell array 300. During the scrubbing operation, the control logic circuit 210 may control the ECC engine 400 such that the ECC engine 400 reads first data corresponding to a first codeword, from at least one sub-page, designated by the scrubbing address, in the selected memory cell row, corrects at least one error bit in the first codeword and writes back the corrected first codeword in a memory location in which the first data are stored.

Figure 2:
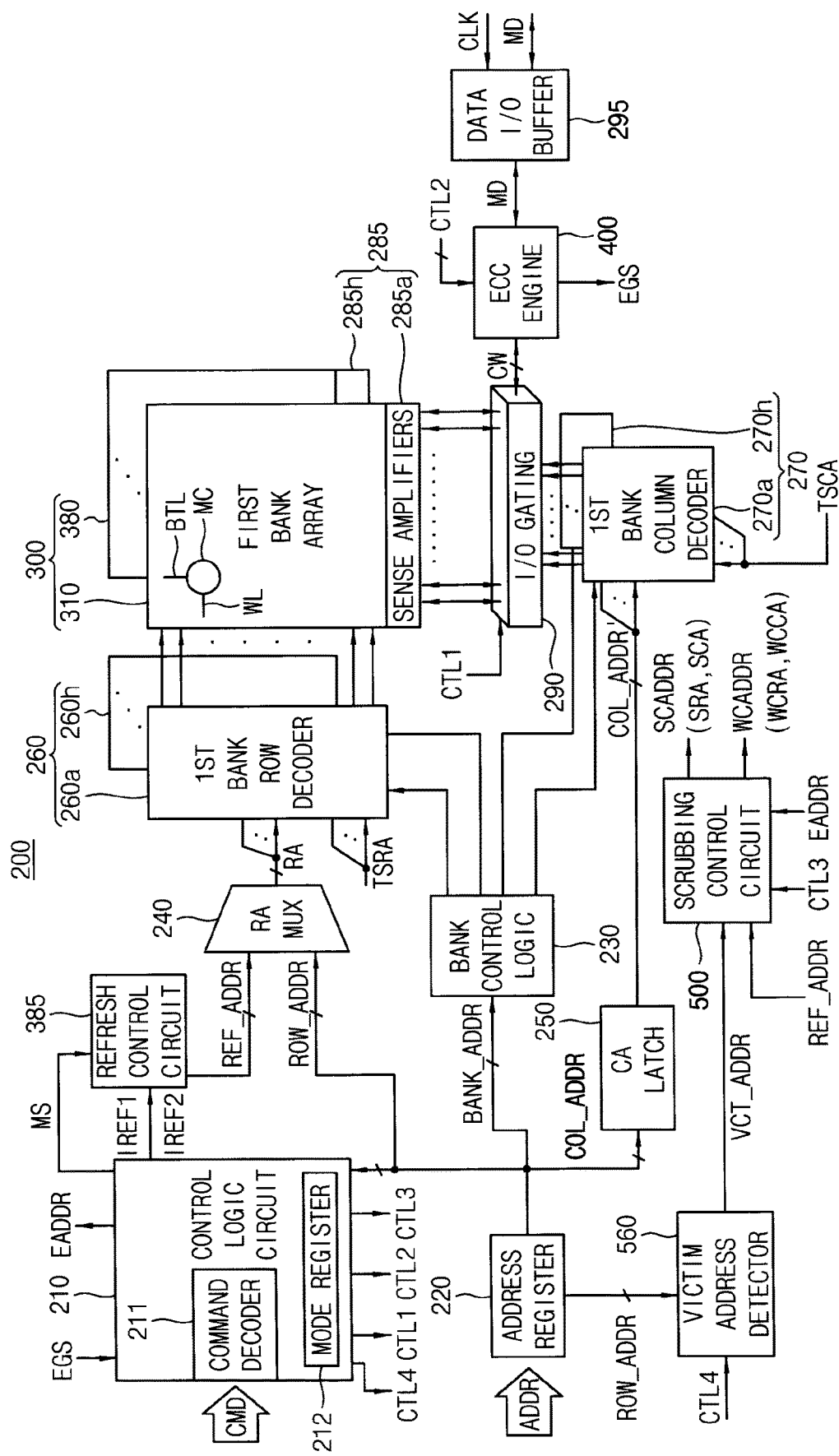
FIG. 2 is a block diagram illustrating the semiconductor memory device in FIG. 1 according to example embodiments.

FIG. 2 is a block diagram illustrating the semiconductor memory device in FIG. 1 according to example embodiments.

Referring to FIG. 2, the semiconductor memory device 200 includes the control logic circuit 210, an address register 220, a bank control logic 230, a refresh control circuit 385, a row address multiplexer 240, a column address latch 250, a row decoder 260, a column decoder 270, the memory cell array 300, a sense amplifier unit 285, an I/O gating circuit 290, the ECC engine 400, the scrubbing control circuit 500, a victim address detector 560, and a data I/O buffer 295.

The memory cell array 300 includes first through eighth bank arrays 310~380. The row decoder 260 includes first through eighth bank row decoders 260a~260h respectively coupled to the first through eighth bank arrays 310~380, the column decoder 270 includes first through eighth bank column decoders 270a~270h respectively coupled to the first through eighth bank arrays 310~380, and the sense amplifier unit 285 includes first through eighth bank sense amplifiers 285a~285h respectively coupled to the first through eighth bank arrays 310~380.

The first through eighth bank arrays 310~380, the first through eighth bank row decoders 260a~260h, the first through eighth bank column decoders 270a~270h and first through eighth bank sense amplifiers 285a~285h may form first through eighth bank banks. Each of the first through eighth bank arrays 310~380 includes a plurality of memory cells MC formed at intersections of a plurality of word-lines WL and a plurality of bit-line BTL.

The address register 220 receives the address ADDR including a bank address BANK_ADDR, a row address ROW_ADDR and a column address COL_ADDR from the memory controller 100. The address register 220 provides the received bank address BANK_ADDR to the bank control logic 230, provides the received row address ROW_ADDR to the row address multiplexer 240, and provides the received column address COL_ADDR to the column address latch 250.

The bank control logic 230 generates bank control signals in response to the bank address BANK_ADDR. One of the first through eighth bank row decoders 260a~260h corresponding to the bank address BANK_ADDR is activated in response to the bank control signals, and one of the first through eighth bank column decoders 270a~270h corresponding to the bank address BANK_ADDR is activated in response to the bank control signals.

The row address multiplexer 240 receives the row address ROW_ADDR from the address register 220, and receives a refresh row address REF_ADDR from the refresh control circuit 385. The row address multiplexer 240 selectively outputs the row address ROW_ADDR or the refresh row address REF_ADDR as a row address RA. The row address RA that is output from the row address multiplexer 240 is applied to the first through eighth bank row decoders 260a~260h.

The refresh control circuit 385 may sequentially output the refresh row address REF_ADDR in response to a first refresh control signal IREF1 or a second refresh control signal IREF2 from the control logic circuit 210.

When the command CMD from the memory controller 100 corresponds to an auto refresh command, the control logic circuit 210 may applies the first refresh control signal IREF1 to the refresh control circuit 385 whenever the control logic circuit 210 receives the auto refresh command. When the command CMD from the memory controller 100 corresponds to a self-refresh entry (SRE) command, the control logic circuit 210 may applies the second refresh control signal IREF2 to the refresh control circuit 385 and the second refresh control signal IREF2 is activated from a time point when the control logic circuit 210 receives the self-refresh entry command to a time point when control logic circuit 210 receives a self-refresh exit (SRX) command. The refresh control circuit 385 may sequentially increase or decrease the refresh row address REF_ADDR in response to receiving the first refresh control signal IREF1 or during the second refresh control signal IREF2 is activated.

The activated one of the first through eighth bank row decoders 260a~260h, by the bank control logic 230, decodes the row address RA that is output from the row address multiplexer 240 or a target scrubbing row address TSRA, and activates a word-line corresponding to the row address RA or the target scrubbing row address TSRA. For example, the activated bank row decoder applies a word-line driving voltage to the word-line corresponding to the row address RA or the target scrubbing row address TSRA.

The column address latch 250 receives the column address COL_ADDR from the address register 220, and temporarily stores the received column address COL_ADDR. In some embodiments, in a burst mode, the column address latch 250 generates column addresses COL_ADDR' that increment from the received column address COL_ADDR. The column address latch 250 applies the temporarily stored or generated column address COL_ADDR' to the first through eighth bank column decoders 270a~270h.

The activated one of the first through eighth bank column decoders 270a~270h activates a sense amplifier corresponding to the bank address BANK_ADDR and the column address COL_ADDR' or a target scrubbing column address TSCA through the I/O gating circuit 290.

The I/O gating circuit 290 includes a circuitry for gating input/output data, and further includes input data mask logic, read data latches for storing data that is output from the first through eighth bank arrays 310~380, and write drivers for writing data to the first through eighth bank arrays 310~380. As an example, the I/O gating circuit 290 may have first through eighth bank I/O gating circuits 290a~290h respectively coupled to the first through eighth bank arrays 310~380.

Codeword CW read from one bank array of the first through eighth bank arrays 310~380 is sensed by a sense amplifier coupled to the one bank array from which the data is to be read, and is stored in the read data latches. The codeword CW stored in the read data latches may be provided to the memory controller 100 via the data I/O buffer 295 after ECC decoding is performed on the codeword CW by the ECC engine 400.

The main data MD to be written in one bank array of the first through eighth bank arrays 310~380 may be provided to the data I/O buffer 295 from the memory controller 100, may be provided to the ECC engine 400 from the data I/O buffer 295, the ECC engine 400 may perform an ECC encoding on the main data MD to generate parity bits, the ECC engine 400 may provide the main data MD and the parity bits to the I/O gating circuit 290 and the I/O gating circuit 290 may write the main data MD and the parity bits in a sub-page of a target page in one bank array through the write drivers.

The data I/O buffer 295 may provide the main data MD from the memory controller 100 to the ECC engine 400 in a write operation of the semiconductor memory device 200, based on the clock signal CLK and may provide the main data MD from the ECC engine 400 to the memory controller 100 in a read operation of the semiconductor memory device 200.

The ECC engine 400 performs an ECC decoding on a codeword read from a sub-page of the target page and may provide an error generation signal EGS to the control logic circuit 210 with correcting at least one error bit when the at least one error bit is detected in the main data MD in the codeword. The control logic circuit 210 may store a row address and a column address of the codeword including the at least one error bit, in an address soring table in the scrubbing control circuit 500 as an error address EADDR.

In an example embodiment, the ECC engine 400 instead of the control logic circuit 210 may store directly the error address EADDR in the address storing table.

The scrubbing control circuit 500 may count the refresh row address REF_ADDR which sequentially changes and may output a normal scrubbing address SCADDR whenever the scrubbing control circuit 500 counts N refresh row addresses. Here, N is a natural number greater than one. The normal scrubbing address SCADDR may include a scrubbing row address SRA and a scrubbing column address SCA. In example embodiments, a memory region corresponding to the normal scrubbing address SCADDR may be predetermined. The memory region corresponding to the normal scrubbing address SCADDR may be designated as a memory location in which a number of error bits greater than a reference number have occurred or an operating temperature is higher than a reference temperature value. As an example, a test operation of the semiconductor memory device 200 may be performed to determine a memory location in which a number of error bits is above a particular amount. The scrubbing control circuit 500 may provide the scrubbing row address SRA and the scrubbing column address SCA to the row decoder 260 and the column decoder 270, respectively in a first scrubbing mode.

The victim address detector 560 may count a number of accesses to a first memory region in the memory cell array 300 to generate at least one victim address VCT_ADDR designating at least one adjacent memory region adjacent to the first memory region when the number of the counted accesses reaches the reference number of times during a reference interval. The victim address VCT_ADDR may be stored in the address storing table of the scrubbing control circuit 500.

The scrubbing control circuit 500, in a second scrubbing mode, may output an address of codeword associated with the error address EADDR or the victim address VCT_ADDR stored in the address storing table as a weak codeword address WCADDR. The weak codeword address WCADDR may include a weak codeword row address WCRA and a weak codeword column address WCCA. The scrubbing control circuit 500 may provide the weak codeword row address WCRA and the weak codeword column address WCCA to the row decoder 260 and the column decoder 270, respectively in the second scrubbing mode.

The target scrubbing row address TSRA may include the scrubbing row address SRA and the weak codeword row address WCRA and the target scrubbing column address TSCA may include the scrubbing column address SCA and the weak codeword column address WCCA.

The control logic circuit 210 may control operations of the semiconductor memory device 200. For example, the control logic circuit 210 may generate control signals for the semiconductor memory device 200 in order to perform a write operation or a read operation. The control logic circuit 210 includes a command decoder 211 that decodes the command CMD received from the memory controller 100 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may generate a first control signal CTL1 to control the I/O gating circuit 290, a second control signal CTL2 to control the ECC engine 400, a third control signal CTL3 to control the scrubbing control circuit 500 and a fourth control signal CTL4 to control the victim address detector 560. In addition, the control logic circuit 210 may provide the refresh control circuit 385 with a mode signal associated with a refresh period. The control logic circuit 210 may generate the mode signal MS based on a temperature signal representing an operating temperature of the semiconductor memory device 200.

Figure 3:
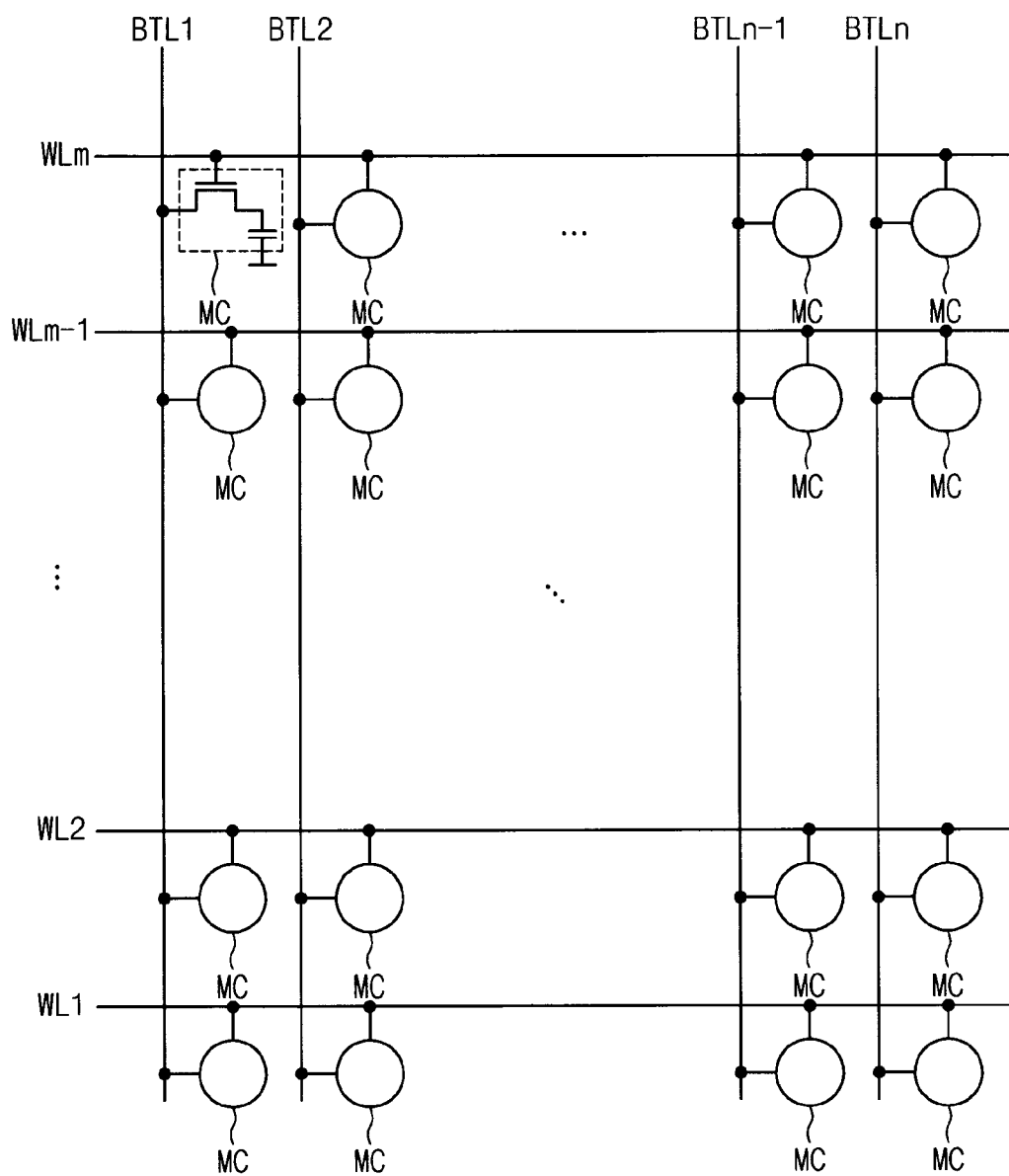
FIG. 3 illustrates an example of the first bank array in the semiconductor memory device of FIG. 2.

FIG. 3 illustrates an example of the first bank array in the semiconductor memory device of FIG. 2.

Referring to FIG. 3, the first bank array 310 includes a plurality of word-lines WL1~WLm (m is a natural number equal to or greater than two), a plurality of bit-lines BTL1~BTLn (n is a natural number equal to or greater than two), and a plurality of memory cells MCs disposed at intersections between the word-lines WL1~WLm and the bit-lines BTL1~BTLn. Each of the memory cells MCs includes a cell transistor coupled to each of the word-lines WL1~WLm and each of the bit-lines BTL1~BTLn and a cell capacitor coupled to the cell transistor.

Figure 4:
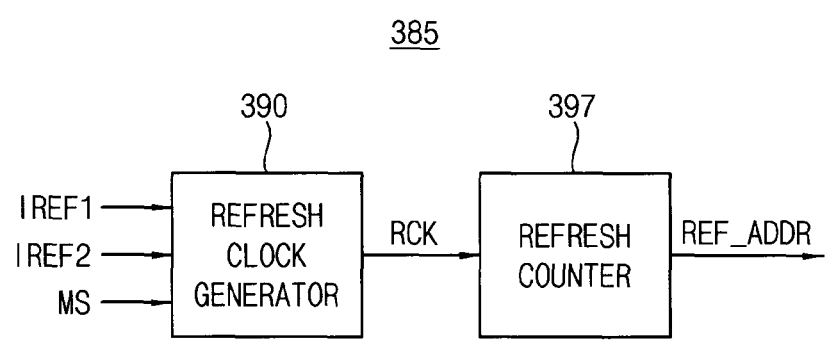
FIG. 4 is a block diagram illustrating the refresh control circuit in the semiconductor memory device of FIG. 2 according to example embodiments.

FIG. 4 is a block diagram illustrating the refresh control circuit in the semiconductor memory device of FIG. 2 according to example embodiments.

Referring to FIG. 4, the refresh control circuit 385 may include a refresh clock generator 390 and a refresh counter 397.

The refresh clock generator 390 may generate a refresh clock signal RCK in response to the first refresh control signal IREF1, the second refresh control signal IREF2 and the mode signal MS. The mode signal MS may determine a refresh period of a refresh operation. As described above, the refresh clock generator 390 may generate the refresh clock signal RCK whenever the refresh clock generator 390 receives the first refresh control signal IREF1 or during the second refresh control signal IREF2 is activated.

The refresh counter 397 may generate the refresh row address REF_ADDR designating sequentially the memory cell rows by performing counting operation at the period of the refresh clock signal RCK.

Figure 5:
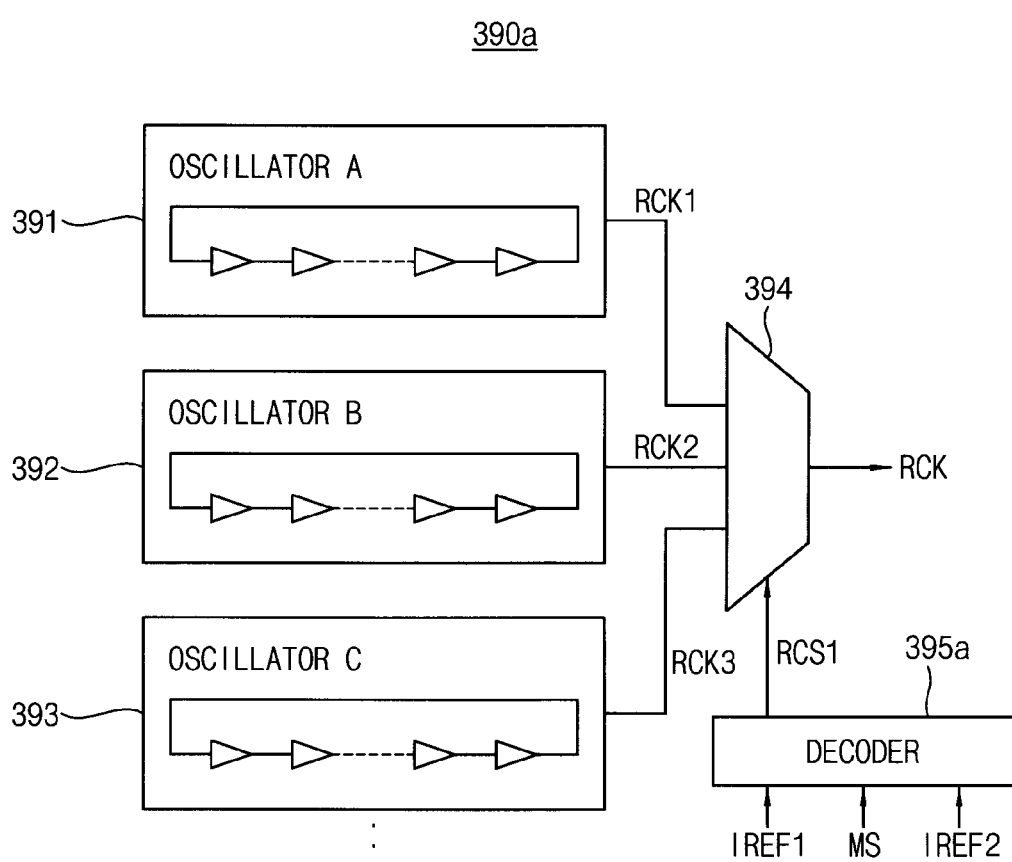
FIG. 5 is a circuit diagram illustrating an example of the refresh clock generator shown in FIG. 4 according to example embodiments.

FIG. 5 is a circuit diagram illustrating an example of the refresh clock generator shown in FIG. 4 according to example embodiments.

Referring to FIG. 5, a refresh clock generator 390a may include a plurality of oscillators 391, 392 and 393, a multiplexer 394 and a decoder 395a. The decoder 395a may decode the first refresh control signal IREF1, the second refresh control signal IREF2 and the mode signal MS to output a clock control signal RCS1. The oscillators 391, 392, and 393 generate refresh clock signals RCK1, RCK2 and RCK3 having different periods. The multiplexer 394 selects one of the refresh clock signals RCK1, RCK2 and RCK3 to provide the refresh clock signal RCK in response to the clock control signal RCS1.

Figure 6:
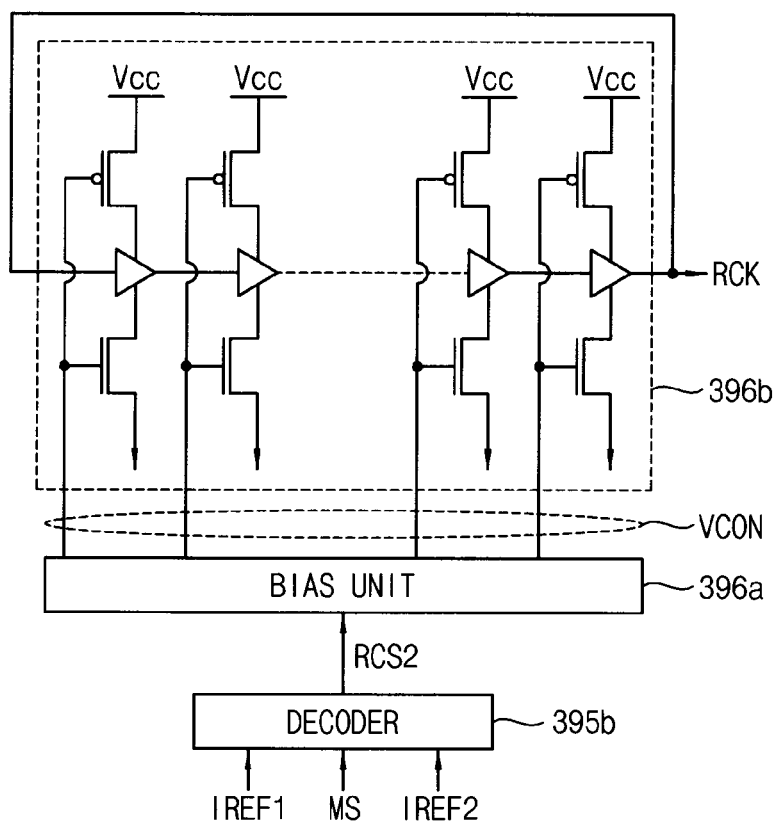
FIG. 6 is a circuit diagram illustrating another example of the refresh clock generator in FIG. 4 according to example embodiments.

FIG. 6 is a circuit diagram illustrating another example of the refresh clock generator in FIG. 4 according to example embodiments.

Referring to FIG. 6, a refresh clock generator 390b may include a decoder 395b, a bias unit 396a and an oscillator 396b. The decoder 395b may decode the first refresh control signal IREF1, the second refresh control signal IREF2 and the mode signal MS to output a clock control signal RCS2. The bias unit 396a generates a control voltage VCON in response to the clock control signal RCS2. The oscillator 396b generates the refresh pulse signal RCK having a variable period, according to the control voltage VCON.

Figure 7:
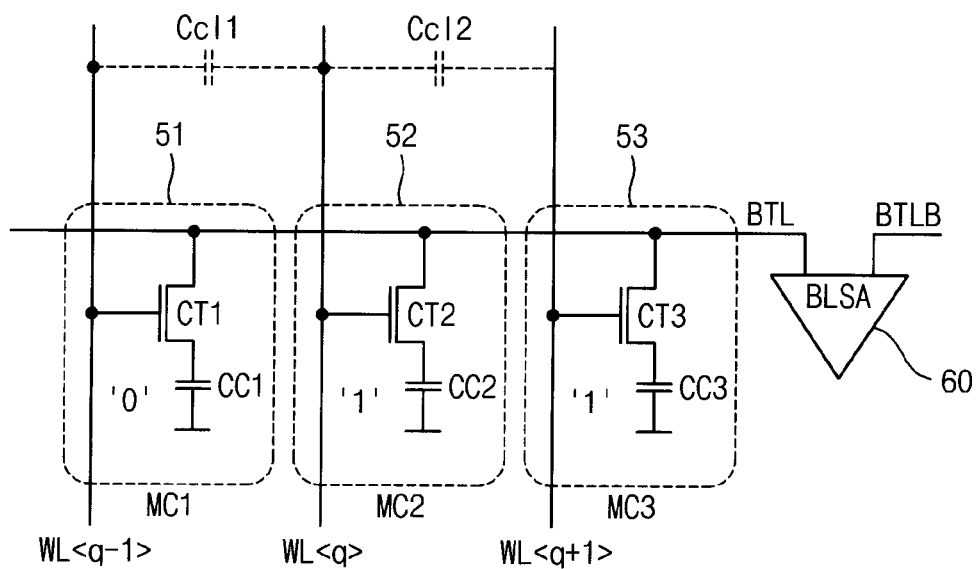
FIG. 7 is a circuit diagram illustrating disturbance between memory cells of a semiconductor memory device.

FIG. 7 is a circuit diagram illustrating disturbance between memory cells of a semiconductor memory device.

Referring to FIG. 7, a part of the semiconductor memory device 200 includes memory cells 51, 52, and 53 and a bit-line sense amplifier 60.

It is assumed that each of the memory cells 51, 52, and 53 is connected to the same bit-line BTL. In addition, the memory cell 51 is connected to a word-line WL<q-1>, the memory cell 52 is connected to a word-line WL<q>, and the memory cell 53 is connected to a word-line WL<q+1>. As shown in FIG. 7, the word-lines WL<q-1> and WL<q+1> are located adjacent to the word-line WL<q>. The memory cell 51 includes an access transistor CT1 and a cell capacitor CC1. A gate terminal of the access transistor CT1 is connected to the word-line WL<q-1> and its one terminal is connected to the bit-line BTL. The memory cell 52 includes an access transistor CT2 and a cell capacitor CC2. A gate terminal of the access transistor CT2 is connected to the word-line WL<q> and its one terminal is connected to the bit-line BTL. Also, the memory cell 53 includes an access transistor CT3 and a cell capacitor CC3. A gate terminal of the access transistor ST3 is connected to the word-line WL<q+1> and its one terminal is connected to the bit-line BTL.

The bit-line sense amplifier 60 may include an N sense amplifier discharging a low level bit line among bit lines BTL and BTLB and a P sense amplifier charging a high level bit line among the bit lines BTL and BTLB.

During a refresh operation, the bit-line sense amplifier 60 rewrites data stored through the N sense amplifier or the P sense amplifier in a selected memory cell. During a read operation or a write operation, a select voltage (for example, Vpp) is provided to the word-line WL<q>. Then, due to capacitive coupling effect, a voltage of adjacent word-lines WL<q−1> and WL<q+1> rises even when no select voltage is applied to the adjacent word-lines WL<q−1> and WL<q+1>. Such capacitive coupling is indicated with parasitic capacitances Ccl1 and Cc2l.

During no refresh operation, when the word-line WL<q> is accessed repeatedly, charges stored in the cell capacitors CC1 and CC3 of the memory cells 51 and 53 connected to the word-lines WL<q−1> and WL<q+1> may leak gradually. In this case, the reliability of a logic '0' stored in the cell capacitor CC1 and a logic '1' stored in the cell capacitor CC3 may not be guaranteed. Therefore, the scrubbing operation on the memory cells is needed at an appropriate time.

Figure 8:
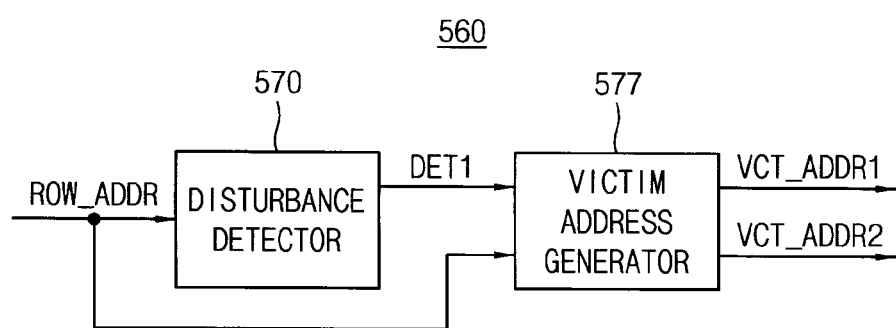
FIG. 8 is a block diagram illustrating an example of the victim address detector in the semiconductor memory device of FIG. 2 according to example embodiments.

FIG. 8 is a block diagram illustrating an example of the victim address detector in the semiconductor memory device of FIG. 2 according to example embodiments.

Referring to FIG. 8, the victim address detector 560 may include a disturbance detector 570 and a victim address generator 577.

The disturbance detector 570 may count a number of accesses to a first memory region (i.e., at least one memory cell row) based on the row address ROW_ADDR and may generate a first detection signal DET1 when the number of the counted accesses reaches a reference number of times during a reference (or predetermined) interval.

The victim address generator 577 may generate at least one of first and second victim addresses VCT_ADDR1 and VCT_ADDR2 in response to the first detection signal DET1. The at least one of first and second victim addresses VCT_ADDR1 and VCT_ADDR2 may be a row address designating a second memory region or a third memory region which are located adjacent to the first memory region. The victim address generator 577 may provide the at least one of first and second victim addresses VCT_ADDR1 and VCT_ADDR2 to an address storing table in the scrubbing control circuit 500.

Figure 9:
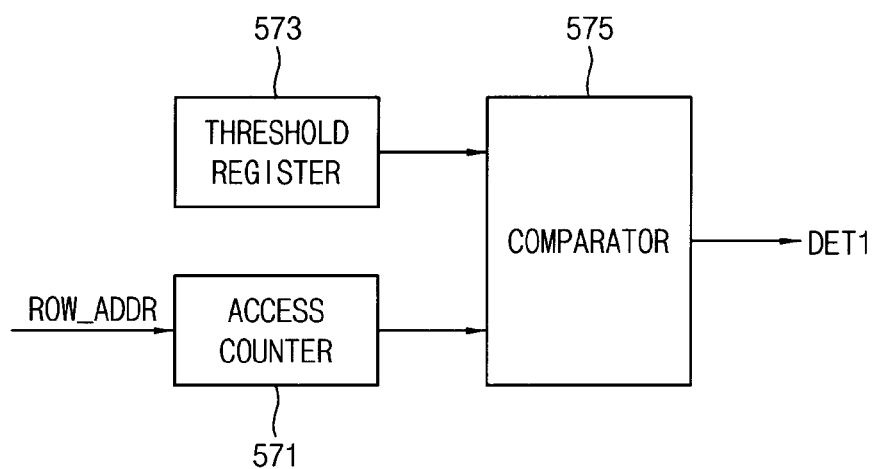
FIG. 9 is a block diagram illustrating the disturbance detector in the victim address detector of FIG. 8.

FIG. 9 is a block diagram illustrating the disturbance detector in the victim address detector of FIG. 8.

Referring to FIG. 9, the disturbance detector 570 may include access counter 571, a threshold register 573 and a comparator 575.

The access counter 571 may count a number of accesses to a specified address (or a specified memory region) based on the row address ROW_ADDR in a predetermined period. For example, the access counter 571 may count a number of accesses to a specified word-line in the predetermined period. The number of accesses may be counted on a specific word-line or a word-line group including at least two word-lines. Moreover, a count of the number of accesses may be performed by a memory unit, for example, a specific block unit, a bank unit, or a chip unit.

The threshold register 573 may store a maximum disturbance occurrence count that guarantees the reliability of data in a specific word-line or a memory unit. For example, a threshold (or a reference number of times) on one word-line may be stored in the threshold register 573. Alternatively, a threshold on one word line group, one block, one bank unit, or one chip unit may be stored in the threshold register 573.

The comparator 575 may compare the reference number of times stored in the threshold register 573 with the number of accesses to a specific memory region counted by the access counter 571. If there is a memory region where the counted number of accesses reaches the reference number of times, the comparator 575 generates the first detection signal DET1. The comparator 575 provides the first detection signal DET1 to the victim address generator 577.

The victim address generator 577 receives the row address ROW_ADDR and generates the at least one of first and second victim addresses VCT_ADDR1 and VCT_ADDR2 in response to the first detection signal DET1.

Figure 10:
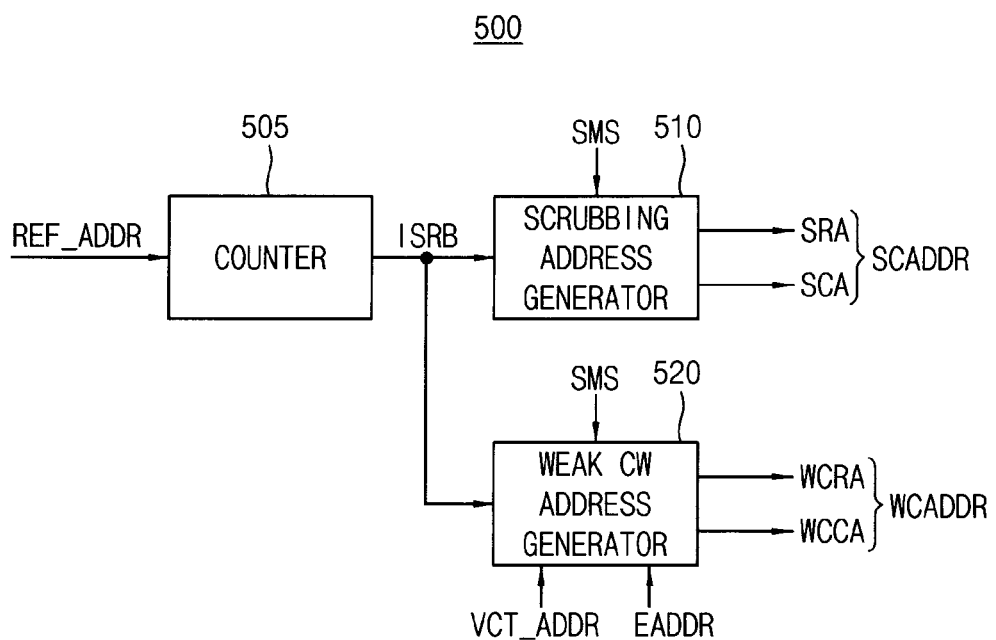
FIG. 10 is a block illustrating an example of the scrubbing control circuit in the semiconductor memory device of FIG. 2 according to example embodiments.

FIG. 10 is a block illustrating an example of the scrubbing control circuit 500 in the semiconductor memory device of FIG. 2 according to example embodiments.

Referring to FIG. 10, the scrubbing control circuit 500 may include a counter 505, a scrubbing address generator 510 and a weak codeword address generator 520.

The counter 505 counts the refresh row address REF_ADDR and generates an internal scrubbing signal ISRB which is activated during a first interval when the counter 505 counts the refresh row address REF_ADDR by a number designated by a counting control signal CCS (not shown). The first interval may correspond to a time interval for refreshing one memory cell row.

The scrubbing address generator 510 generates a normal scrubbing address SCADDR associated with a normal scrubbing operation for codewords in each of the memory cell rows, which gradually changes in the first scrubbing mode, in response to the internal scrubbing signal ISRB and the scrubbing mode signal SMS.

The normal scrubbing address SCADDR includes a scrubbing row address SRA and a scrubbing column address SCA. The scrubbing row address SRA designates one page in one bank array and the scrubbing column address SCA designates one of codewords in the one page. The scrubbing address generator 510 provides the scrubbing row address SRA to a corresponding row decoder and provides the scrubbing column address SCA to a corresponding column decoder.

The scrubbing operation performed based on the normal scrubbing address SCADDR may be referred to as a normal scrubbing operation because the scrubbing operation performed based on the normal scrubbing address SCADDR is performed on all codewords included in the memory cell array 300.

The weak codeword address generator 520 generates a weak codeword address WCADDR associated with a weak scrubbing operation associated with weak codewords in the bank array in a second scrubbing mode, in response to the internal scrubbing signal ISRB and the scrubbing mode signal SMS. The weak codeword address WCADDR includes a weak codeword row address WCRA and a weak codeword column address WCCA. The scrubbing mode signal SMS indicates the first scrubbing mode when the scrubbing mode signal SMS has a first logic level and indicates the second scrubbing mode when the scrubbing mode signal SMS has a second logic level different from the first logic level. The scrubbing mode signal SMS may be included in the third control signal CTL3. The weak codeword address generator 520 provides the weak codeword row address WCRA to a corresponding row decoder and provides the weal codeword column address WCCA to a corresponding column decoder.

The weak codeword address generator 520 may include an address storing table therein and the address storing table may store addresses of codewords associated with the victim address VCT_ADDR and the error address EADDR.

The scrubbing operation performed based on the weak codeword address WCADDR may be referred to as a weak scrubbing operation because the scrubbing operation performed based on the weak codeword address WCADDR is performed on weak codewords included in the memory cell array 300.

Figure 11:
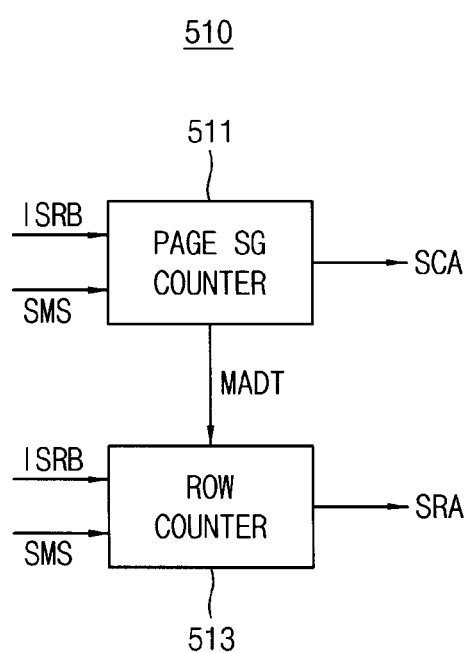
FIG. 11 is a block diagram illustrating the scrubbing address generator in the scrubbing control circuit of FIG. 10 according to example embodiments.

FIG. 11 is a block diagram illustrating the scrubbing address generator in the scrubbing control circuit of FIG. 10 according to example embodiments.

Referring to FIG. 11, the scrubbing address generator 510 may include a page segment counter 511 and a row counter 513.

The page segment counter 511 increases the scrubbing column address SCA by one while the internal scrubbing signal ISRB is activated in the first scrubbing mode and actives a maximum address detection signal MADT with being reset whenever the scrubbing column address SCA reaches its maximum value, in response to the internal scrubbing signal ISRB and the scrubbing mode signal SMS. The page segment counter 511 provides the maximum address detection signal MADT to the row counter 513.

The row counter 513 starts counting operation by receiving the internal scrubbing signal ISRB initially and increases the scrubbing row address SRA by one whenever the activated maximum address detection signal MADT in response to the internal scrubbing signal ISRB and the scrubbing mode signal SMS. Since the internal scrubbing signal ISRB is activated during the first interval while a refresh operation is not performed on one memory cell row, the page segment counter 511 may generate the scrubbing column address SCA associated with codewords in one page during the first interval.

Figure 12:
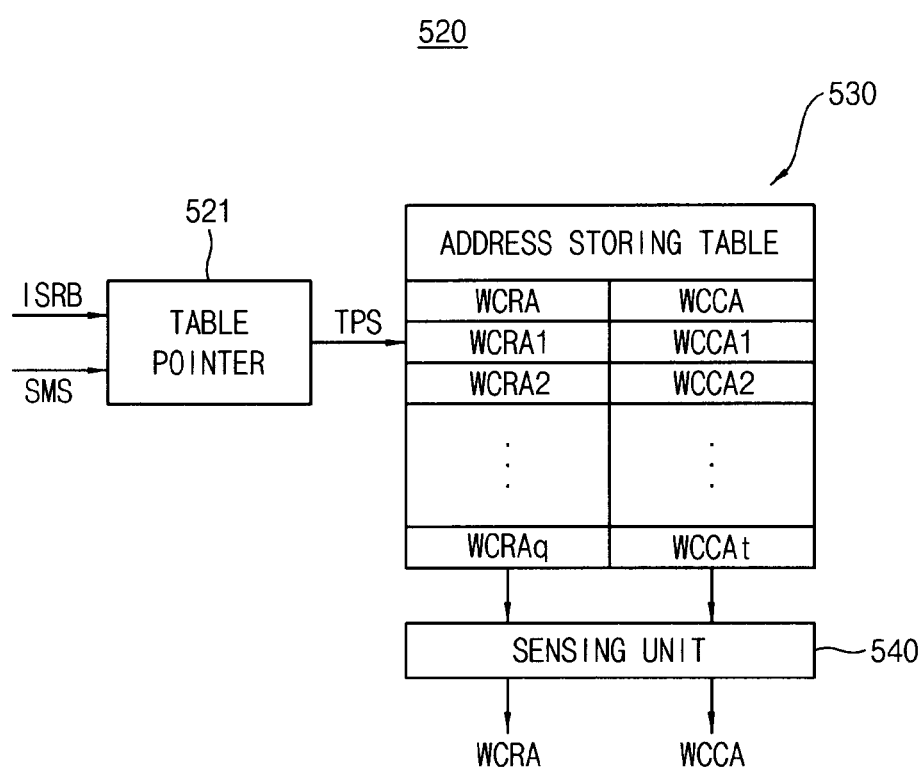
FIG. 12 illustrates the weak codeword address generator in the scrubbing control circuit of FIG. 10 according to example embodiments.

FIG. 12 illustrates the weak codeword address generator in the scrubbing control circuit of FIG. 10 according to example embodiments.

Referring to FIG. 12, the weak codeword address generator 520 may include a table pointer 521, an address storing table 530 and a sensing unit 540.

The address storing table 530 stores address information WCRA1~WCRAq (q is a natural number greater than 1) and WCCA1~WCCAt (t is a natural number greater than 1) of weak codewords included in the memory cell array 300. The address information WCRA1~WCRAq is designated as the weak codeword row addresses and address information WCCA1~WCCAt is designated as the weak codeword column addresses. The weak codewords may be all or some of a weak page including a number of error bit greater than a reference value among pages in the first bank array 310. In addition, the weak codewords may be codewords of neighbor pages adjacent to the intensively accessed memory region.

The table pointer 521 may generate a pointer signal TPS which provide location information for the address storing table 530 in response to the internal scrubbing signal ISRB and the scrubbing mode signal SMS during the first interval in the second scrubbing mode, and provides the pointer signal TPS to the address storing table 530. The address storing table 530 may include a nonvolatile storage. The at least one of first and second victim addresses VCT_ADDR1 and VCT_ADDR2 provided from the victim address generator 577 in FIG. 8 may be stored in the address storing table 530.

The pointer signal TPS gradually increases by a predetermined time period during the first interval and the address storing table 530 may output the weak codeword address stored in a location (indicated by the pointer signal TPS) as the weak codeword row address WCRA and the weak codeword column address WCCA through the sensing unit 540 in response to the pointer signal TPS whenever the pointer signal TPS is applied. The sensing unit 540 provides the weak codeword row address WCRA to a corresponding row decoder as a target scrubbing row address TSRA and provides the weak codeword column address WCCA to a corresponding column decoder as a target scrubbing column address TSCA.

As mentioned above, the control logic circuit 210 may provide the error address EADDR to the scrubbing control circuit 500. When the scrubbing control circuit 500 performs K scrubbing operation on a specific memory cell row and the ECC engine 400 detects an error bit in reading the specific memory cell row, it is determined that the specific memory cell row has a permanent fault. The error bits may be accumulated when the specific memory cell row having the permanent fault is not replaced. Therefore, the control logic circuit 210 or the memory controller 100 may replace the specific memory cell row having the permanent fault with a redundancy memory cell row through a redundancy repair operation.

In addition, the control logic circuit 210 may apply different refresh periods to some memory cell rows based on a number of error bits for each of the memory cell rows, which are detected by the scrubbing operation.

Figure 13:
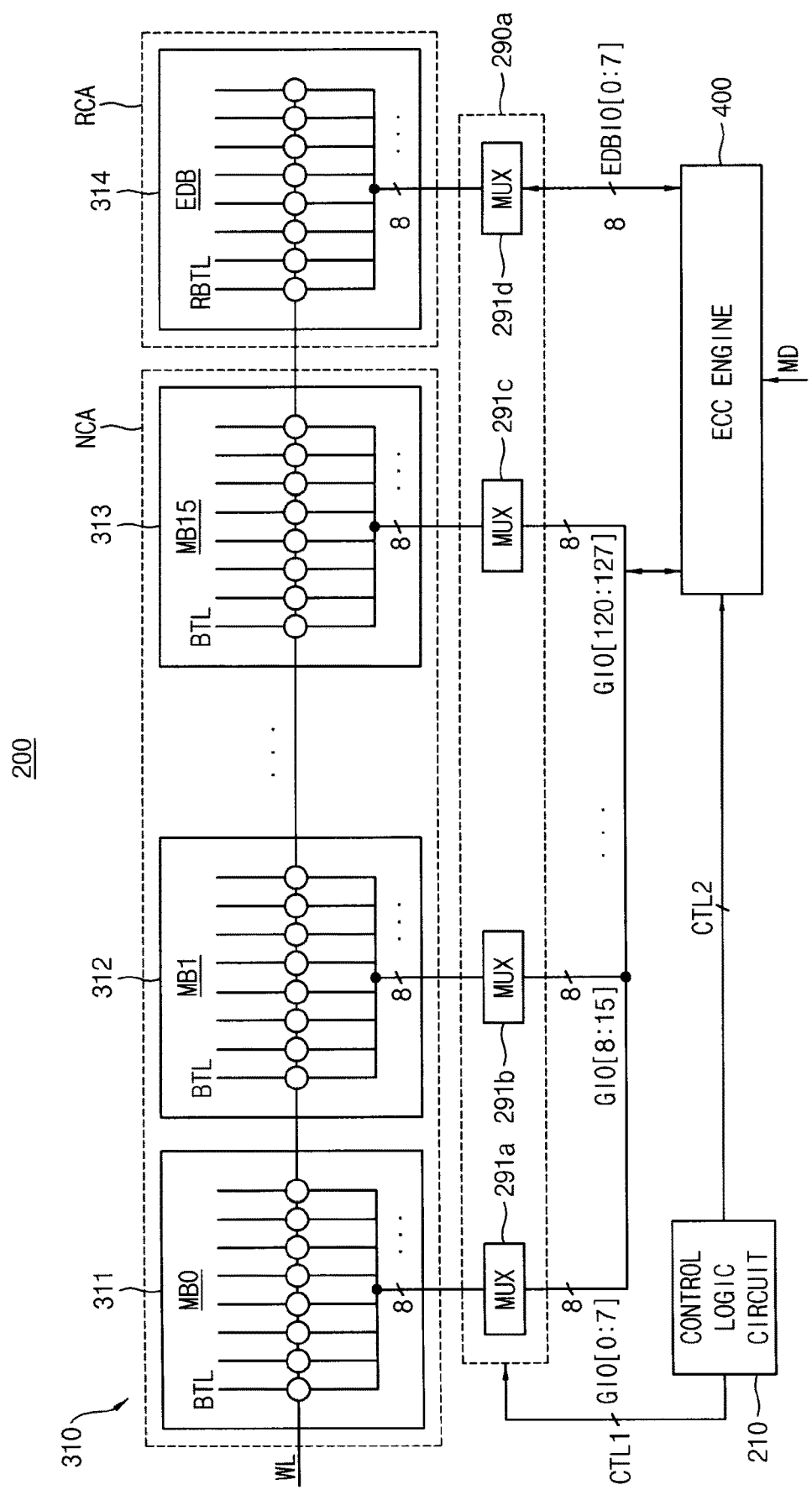
FIG. 13 illustrates a portion of the semiconductor memory device of FIG. 2 in a write operation.

FIG. 13 illustrates a portion of the semiconductor memory device of FIG. 2 in a write operation.

In FIG. 13, the control logic circuit 210, the first bank array 310, the first I/O gating circuit 290a, and the ECC engine 400 are illustrated.

Referring to FIG. 13, the first bank array 310 includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks determining a memory capacity of the semiconductor memory device 200. The second memory block 314 is for ECC and/or redundancy repair. Since the second memory block 314 for ECC and/or redundancy repair is used for ECC, data line repair and block repair to repair 'fail' cells generated in the first memory blocks 311~313, the second memory block 314 is also referred to as an EDB block. In each of the first memory blocks 311~313, a plurality of first memory cells are arranged in rows and columns. In the second memory block 314, a plurality of second memory cells are arranged in rows and columns. The first memory cells connected to intersections of the word-lines WL and the bit-lines BTL may be dynamic memory cells. The second memory cells connected to intersections of the word-lines WL and bit-lines RBTL may be dynamic memory cells.

The first I/O gating circuit 290a includes a plurality of switching circuits 291a~291d respectively connected to the first memory blocks 311~313 and the second memory block 314. In the semiconductor memory device 200, bit-lines corresponding to data of a burst length (BL) may be simultaneously accessed to support the BL indicating the maximum number of column positions that is accessible. For example, the BL may be set to 8.

The first I/O gating circuit 290a may select bit lines BTL by the plurality of switching circuits 291a~291d based on a column address. As an example, in write operation, the first I/O gating circuit 290a selects 8 first data lines GIO and 8 second data lines EDBIO for each of the first memory blocks 311~313 and the second memory block 314.

Although FIG. 13 illustrates an example in which sense amplifiers are not disclosed, the first bank sense amplifiers 285a may be coupled between the first bank array 310 and the first I/O gating circuit 290a.

The ECC engine 400 may be connected to the switching circuits 291a~291d through first data lines GIO[0:127] and second data lines EDBIO[0:15]. The control logic circuit 210 may receive the command CMD and the address ADDR and may decode the command CMD to generate the first control signal CTL1 for controlling the switching circuits 291a~291d and the second control signal CTL2 for controlling the ECC engine 400.

When the command CMD is a write command, the control logic circuit 210 provides the second control signal CTL2 to the ECC engine 400 and the ECC engine 400 performs the ECC encoding on the main data MD to generate parity bits associated with the main data MD and provides the first I/O gating circuit 290a with the codeword CW including the main data MD and the parity bits. The control logic circuit 210 provides the first control signal CTL1 to the first I/O gating circuit 290a such that the codeword CW is to be stored in a sub-page of the target page in the first bank array 310.

Figure 14:
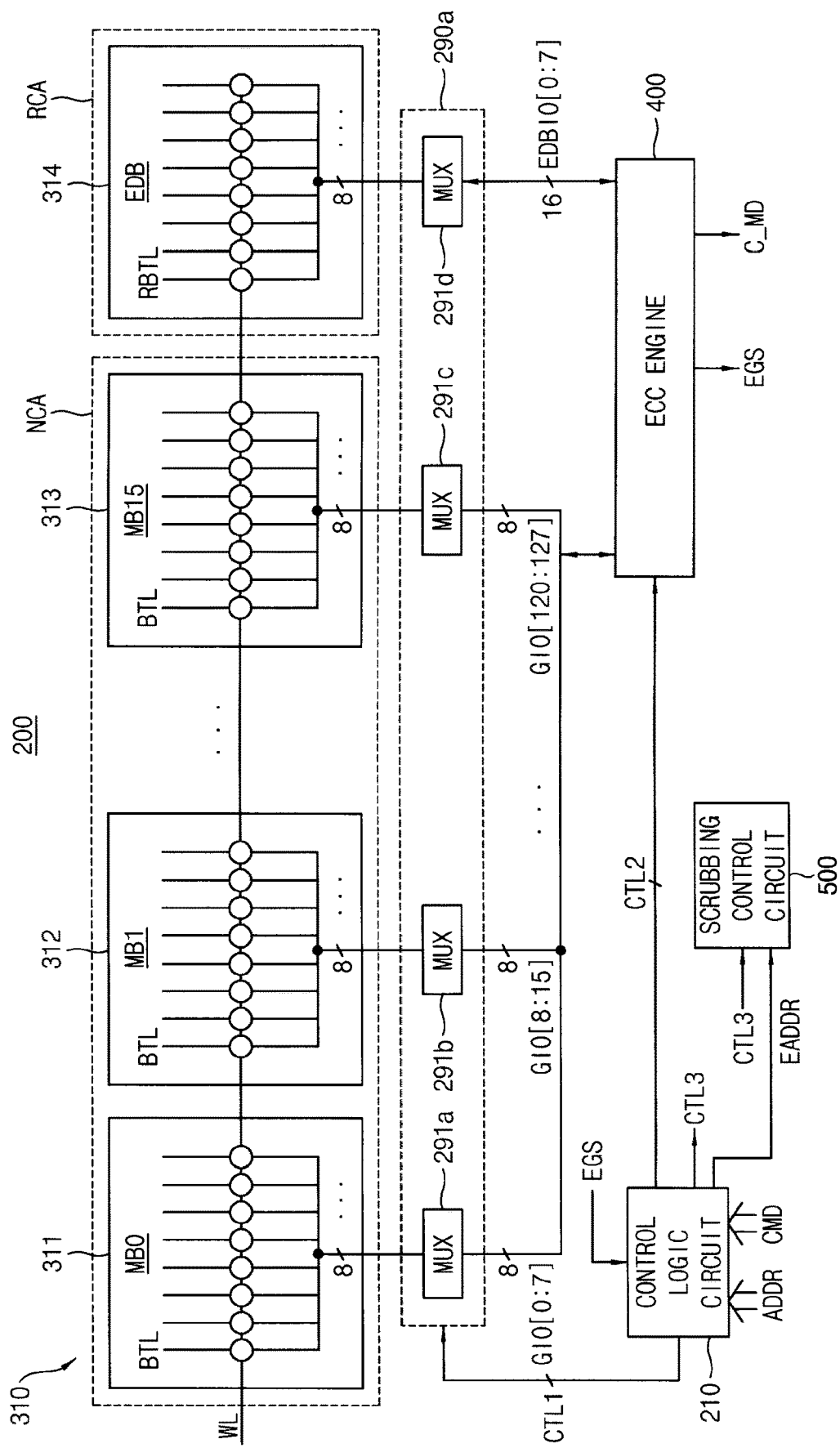
FIG. 14 illustrates a portion of the semiconductor memory device of FIG. 2 in a read operation or a refresh operation.

FIG. 14 illustrates a portion of the semiconductor memory device of FIG. 2 in a read operation or a refresh operation.

In FIG. 14, the control logic circuit 210, the first bank array 310, the first I/O gating circuit 290a, the ECC engine 400 and the scrubbing control circuit 500 are illustrated.

Referring to FIG. 14, when the command CMD is a refresh command (a first command) to designate a refresh operation or a read command (a second command) to designate a read operation, the control logic circuit 210 provides the first control signal CTL1 to the first I/O gating circuit 290a such that a first (read) codeword RCW stored in the sub-page of the target page in the first bank array 310 is provided to the ECC engine 400. Although FIG. 14 illustrates an example in which sense amplifiers are not disclosed, the first bank sense amplifiers 285a may be coupled between the first bank array 310 and the first I/O gating circuit 290a.

In the read operation, the ECC engine 400 performs the ECC decoding on the codeword RCW and provides the error generation signal EGS to the control logic circuit 210. The control logic circuit 210 may store an address (i.e., a row address and a column address) of the codeword RCW in the address storing table 530 as the error address EADDR when the codeword RCW includes at least one error bit. In the refresh operation on weak pages designated by the weak address WEAK_ADDR, the ECC engine 400 performs the ECC decoding on the codeword RCW. When the codeword RCW includes at least one error bit, the ECC engine 400 may perform the scrubbing operation to correct the at least one error bit, and to write back the corrected main data in the sub-page. When an error bit is detected during the scrubbing operation, the ECC engine 400 may provide the error generation signal EGS to the control logic circuit 210 whenever the error bit is detected. The ECC engine 400 counts a number of the error generation signal EGS with respect to one page, and stores an address of the one page in the address storing table 530 as the error address EADDR when the counted value exceeds a threshold value. The scrubbing operation may be performed on some codewords in a selected memory cell row whenever N refresh operations are performed on the memory cell rows by counting N refresh row addresses.

When the command CMD is a read command, the ECC engine 400 may provide the corrected main data C_MD to the data I/O buffer 295.

The first I/O gating circuit 290a selects bit lines BTL from each of the first memory blocks 311~313 and the second memory block 314 based on a column address. As an example, in a scrubbing operation, one word line is activated based on a scrubbing row address and one codeword read from each of the first memory blocks 311~313 and the second memory block 314 is transmitted to the ECC engine 400 through selected bit lines BTL based on a scrubbing column address. As an example, one codeword (e.g., main data from each of the first memory blocks 311~313 and parity data from the second memory block 314) may be read from a sub-page when one word line is activated.

In a read or scrubbing operation, the first I/O gating circuit 290a may select bit lines BTL through the switching circuits 291a~291d based on a column address. As an example, the first I/O gating circuit 290a selects 8 bit lines BTL and 8 bit-lines RBTL from each of the first memory blocks 311~313 and the second memory block 314.

As an example, each of the first memory blocks 311~313 may include 512 bit lines BTL and the second memory block 314 may include 512 bit lines RBTL. As an example, first I/O gating circuit 290a may select 8 bit lines BTL from each of the first memory blocks 311~313, and may select 8 bit lines RBTL from the second memory block 314. Thus, one codeword CW may include 128 main data MD and 8 parity bits.

Figure 15:
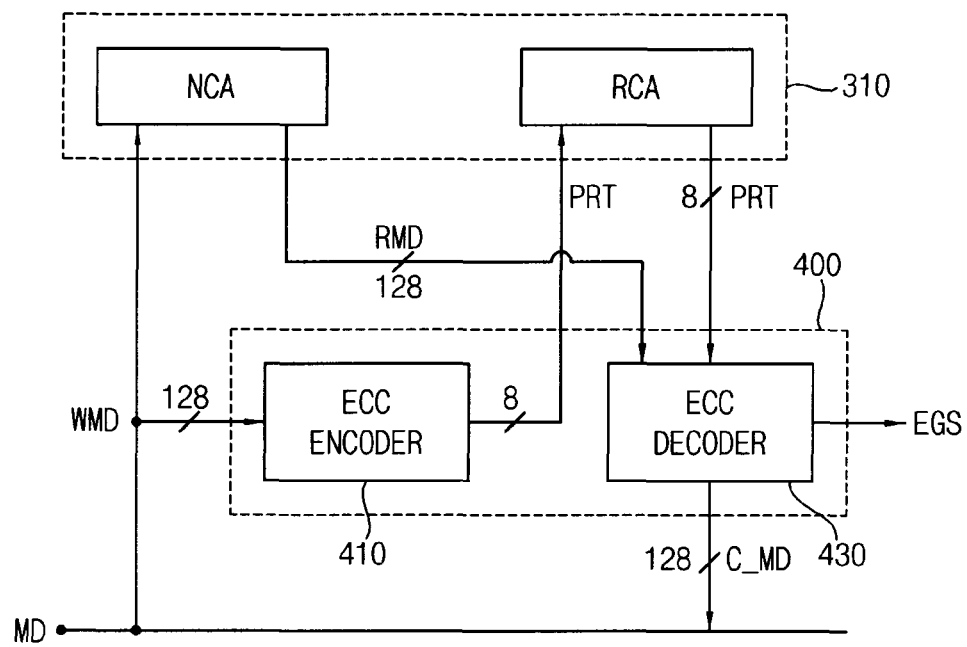
FIG. 15 is a block diagram illustrating an example of the ECC engine in the semiconductor memory device of FIG. 2 according to example embodiments.

FIG. 15 is a block diagram illustrating an example of the ECC engine in the semiconductor memory device of FIG. 2 according to example embodiments.

Referring to FIG. 15, the ECC engine 400 includes an ECC encoder 410 and an ECC decoder 430.

The ECC encoder 410 may generate parity bits PRT associated with a write data WMD to be stored in the normal cell array NCA of the first bank array 310. The parity bits PRT may be stored in the redundancy cell array RCA of the first bank array 310.

The ECC decoder 430 may perform an ECC decoding on a read data RMD based on the read data RMD and the parity bits PRT read from the first bank array 310. When the read data RMD includes at least one error bit as a result of the ECC decoding, the ECC decoder 430 provides the error generation signal EGS to the control logic circuit 210, and corrects the error bit in the read data RMD to output the corrected main data C_MD.

Figure 16:
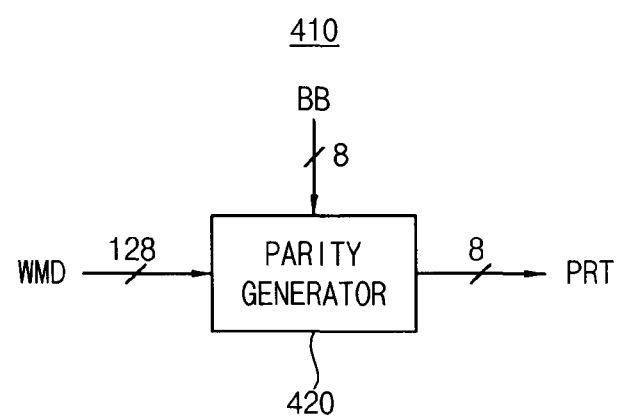
FIG. 16 illustrates an example of the ECC encoder in the ECC engine of FIG. 15 according to example embodiments.

FIG. 16 illustrates an example of the ECC encoder in the ECC engine of FIG. 15 according to example embodiments.

Referring to FIG. 16, the ECC encoder 410 may include a parity generator 420. The parity generator 420 receives 128-bit write data WMD and 8-bit basis bit BB and generates the 8-bit parity bits PRT by performing, for example, an XOR array operation. The basis bit BB is bits for generating the parity bits PRT with respect to the 128-bit write data WMD and may include b'0000000. The basis bit BB may include other particular bits instead of b'0000000.

Figure 17:
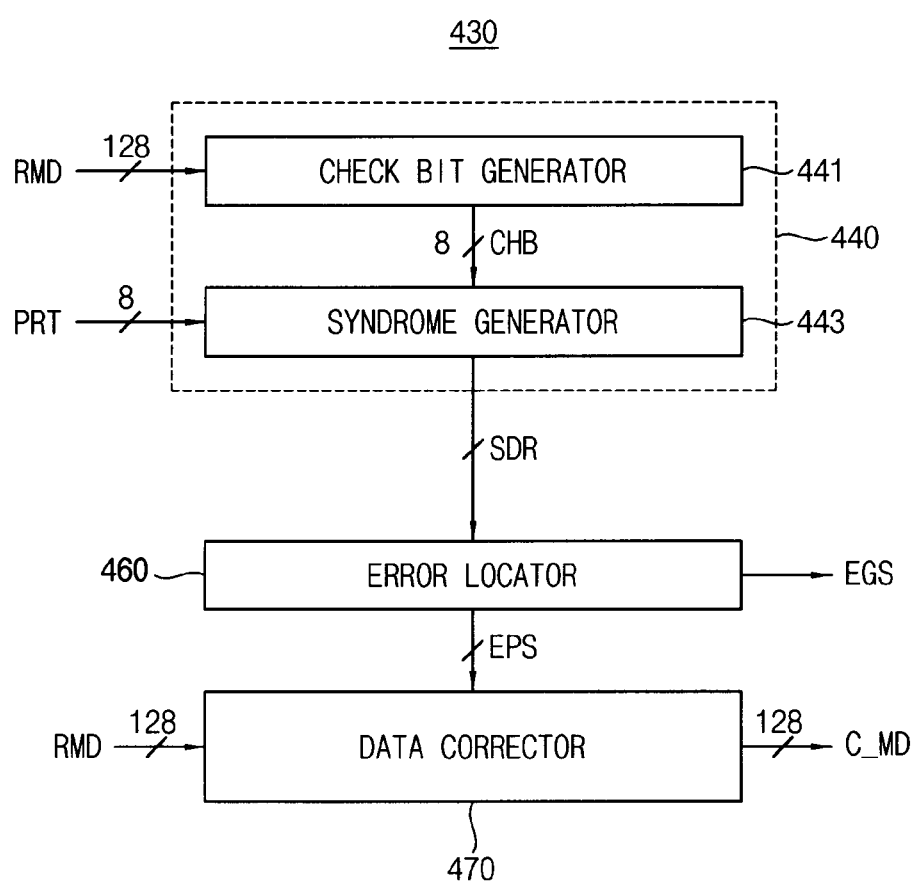
FIG. 17 illustrates an example of the ECC decoder in the ECC engine of FIG. 15 according to example embodiments.

FIG. 17 illustrates an example of the ECC decoder in the ECC engine of FIG. 15 according to example embodiments.

Referring to FIG. 17, the ECC decoder 430 may include a syndrome generation circuit 440, an error locator 460 and a data corrector 470. The syndrome generation circuit 440 may include a check bit generator 441 and a syndrome generator 443.

The check bit generator 441 generates check bits CHB based on the read data RMD by performing, an XOR array operation and the syndrome generator 443 generates a syndrome SDR by comparing corresponding bits of the parity bits PRT and the check bits CHB.

The error locator 460 generates an error position signal EPS indicating a position of an error bit in the read data RMD to provide the error position signal EPS to the data corrector 470 when all bits of the syndrome SDR are not 'zero'. In addition, when the read data RMD includes the error bit, the error locator 460 provides the error generation signal EGS to the control logic circuit 210.

The data corrector 470 receives the read data RMD, corrects the error bit in the read data RMD based on the error position signal EPS when the read data RMD includes the error bit and outputs the corrected main data C_MD.

Figure 18:
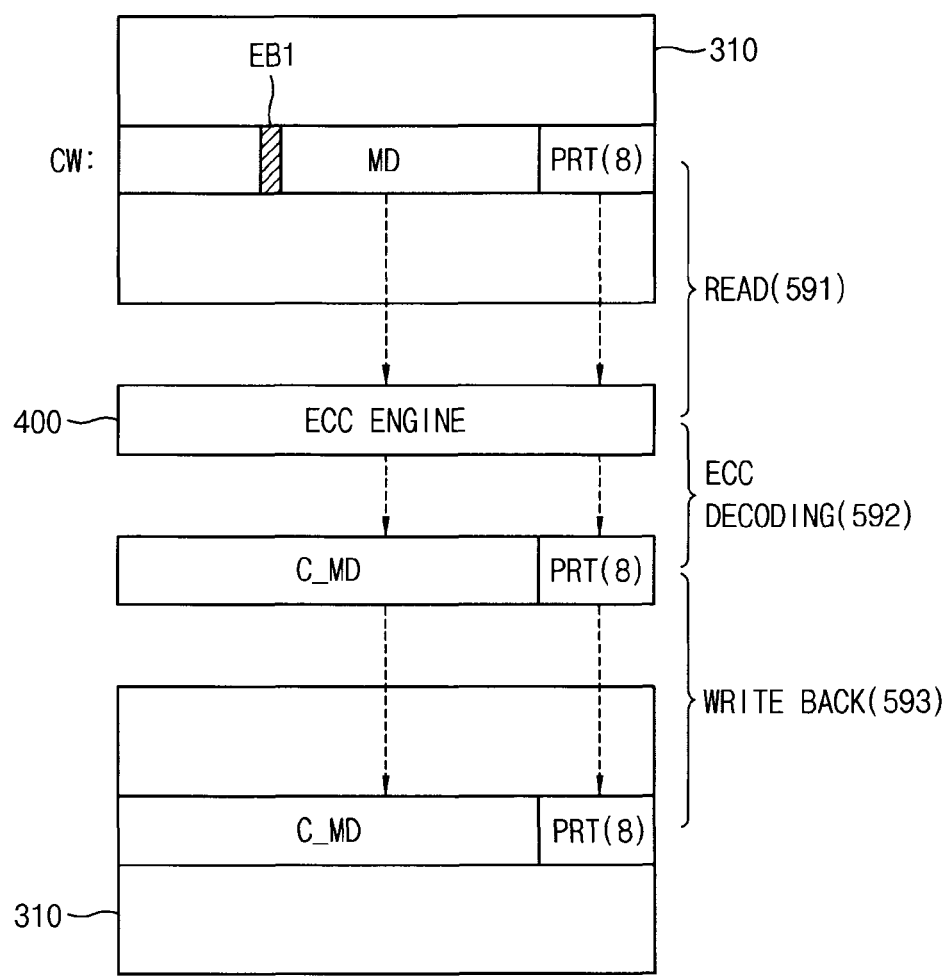
FIG. 18 illustrates an operation of the ECC decoder of FIG. 17 according to example embodiments.

FIG. 18 illustrates an operation of the ECC decoder of FIG. 17 according to example embodiments.

Referring to FIGS. 17 and 18, in a scrubbing operation in response to a refresh command, the codeword CW includes at least one error bit EB1. The codeword CW is read from a sub-page of a first page and is provides to the ECC engine 400 as a reference numeral 591 indicates. The ECC engine 400 performs the ECC decoding on the codeword CW to correct the at least one error bit EB1 as a reference numeral 592 indicates and writes back the corrected main data C_MD in the sub-page of the first page as a reference numeral 593 indicates.

Figure 19:
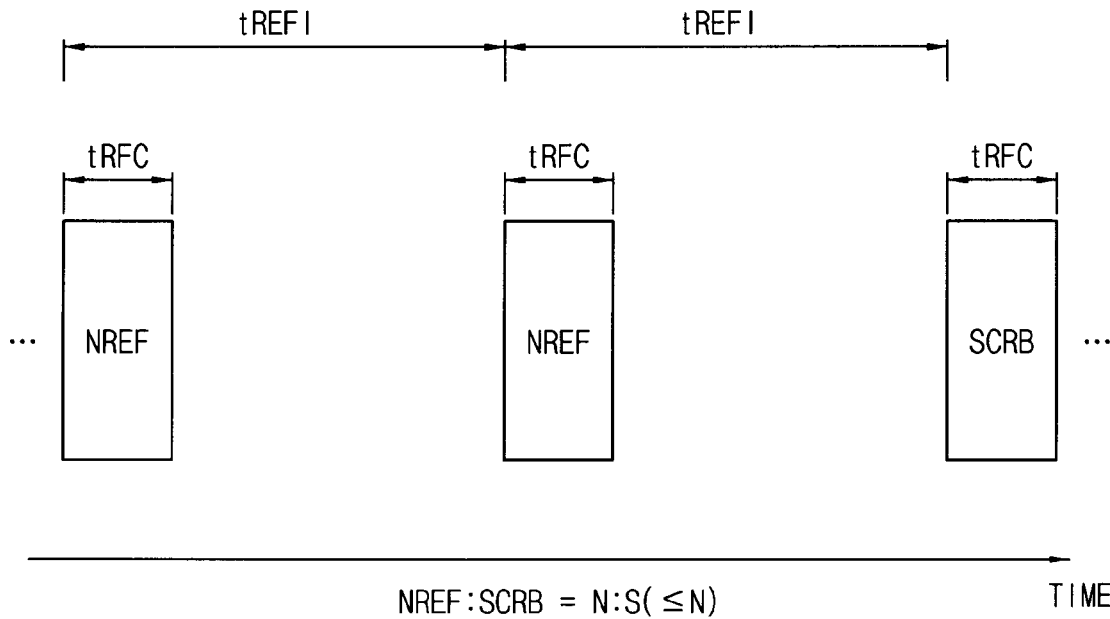
FIG. 19 illustrates a normal refresh operation and a scrubbing operation performed in the semiconductor memory device of FIG. 2.

FIG. 19 illustrates a normal refresh operation and a scrubbing operation performed in the semiconductor memory device of FIG. 2.

In FIG. 19, tRFC denotes a refresh cycle and means a time for refreshing one row, and tREFI denotes a refresh interval and means an interval between two consecutive refresh commands or two consecutive refresh row addresses.

Referring to FIG. 19, it is noted that the scrubbing control circuit 500 designates memory cell rows S times, on which the ECC engine performs the scrubbing operation SCRB whenever the normal refresh operation NREF is performed on memory cell rows N-times in response to the refresh command and the refresh row address. Here, N and S are a natural number greater than 1. As an example, N is equal to or greater than S.

In example embodiments, the normal refresh operation NREF is not performed during the scrubbing operation SCRB.

Figure 20:
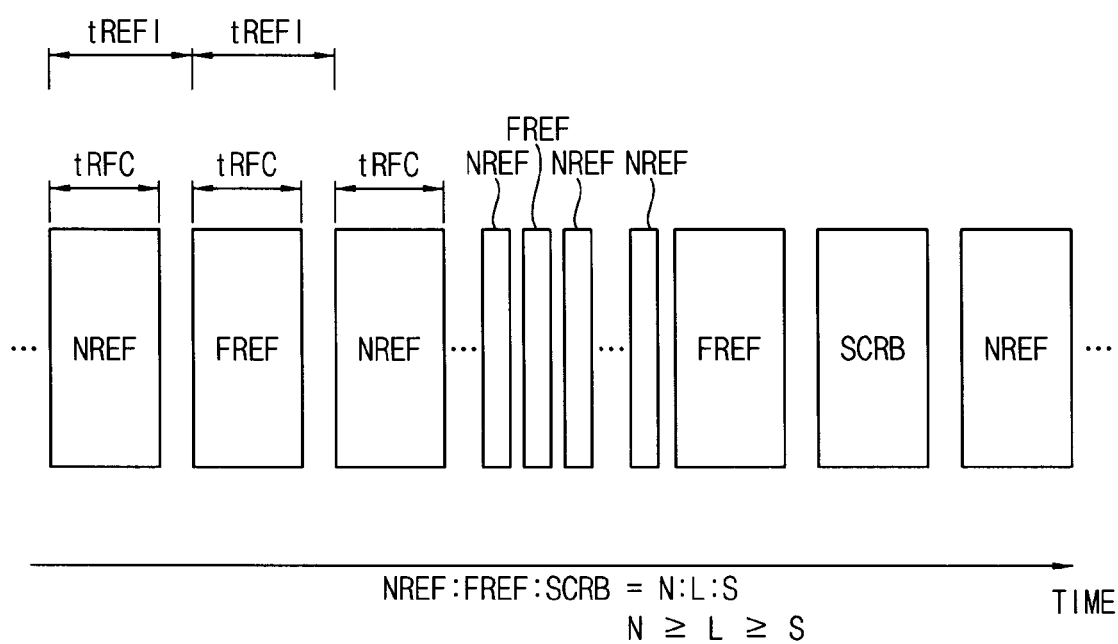
FIG. 20 illustrates a normal refresh operation and a scrubbing operation performed in the semiconductor memory device of FIG. 2.

FIG. 20 illustrates a normal refresh operation and a scrubbing operation performed in the semiconductor memory device of FIG. 2.

Referring to FIG. 20, it is noted that the scrubbing control circuit 500 designates memory cell rows S times, on which the ECC engine 400 performs the scrubbing operation SCRB and a refresh operation FREF on an adjacent memory region corresponding to the victim address VCT_ADDR is performed L times whenever the normal refresh operation NREF is performed on memory cell rows N-times in response to the refresh command. Here L is a natural number smaller than N and S is a natural number smaller than L. Here, N, L and S are a natural number greater than 1. As an example, N is equal to or greater than L and L is equal to or greater than S.

In example embodiments, the normal refresh operation NREF is not performed during the scrubbing operation SCRB.

In example embodiments, referring to FIGS. 19 and 20, the N normal refresh operations NREF may be performed by counting the refresh row addresses in response to a refresh command, for example, the self-refresh entry (SRE) command for a self-refresh operation.

Figure 21:
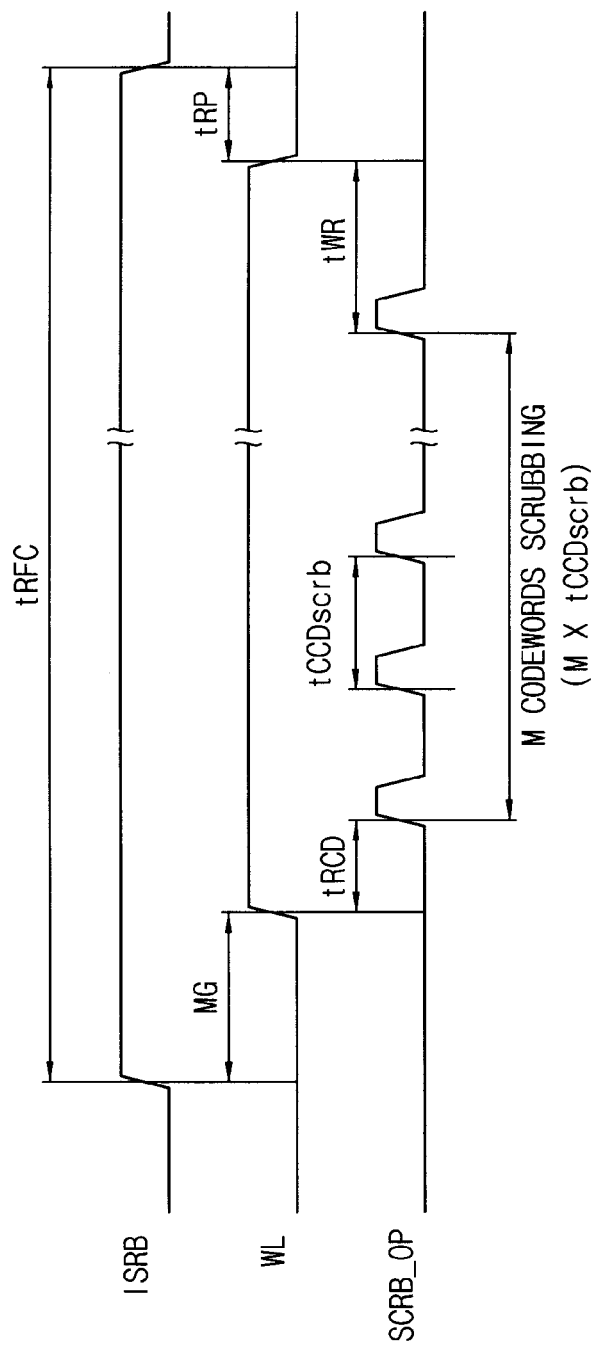
FIG. 21 illustrates a timing of the scrubbing operation in FIG. 19 or in FIG. 20.

FIG. 21 illustrates a timing of the scrubbing operation in FIG. 19 or in FIG. 20.

Referring to FIG. 21, during a period of time which is the refresh cycle tRFC, the internal scrubbing signal ISRB is activated with a logic high level. A word-line WL coupled to a memory cell row designated by the scrubbing row address is activated after the internal scrubbing signal ISRB is activated and a margin MG elapses. Scrubbing operation SCRB_OP is sequentially performed on M codewords in the memory cell row designated by the scrubbing row address after the word-line WL is activated and RAS to CAS delay time tRCD elapses. Here, M is a natural number equal to or greater than 1. The scrubbing operation on one codeword is performed during a time interval tCCDscrb. For example, during the time interval tCCDscrb, corrected codewords are written back in corresponding memory locations. The word-line WL is deactivated after a write recovery time TWR. The internal scrubbing signal ISRB is deactivated after the word-line is deactivated and a row precharge time tRP elapses.

Accordingly, the ECC engine 400 sequentially performs the scrubbing operation on at least one codeword in a first memory cell row while the refresh operation is not performed on another memory cell row.

In the scrubbing operation, the ECC engine 400 may read one codeword from one sub-page which is selected from each of the first memory blocks 311~313 and the second memory block 314.

In example embodiments, the normal refresh operation NREF is not performed in response to the internal scrubbing signal ISRB during the scrubbing operation. As an example, the refresh control circuit 385 does not generate new refresh row address REF_ADDR (e.g., maintaining the status of the previous refresh row address REF_ADDR) while the internal scrubbing signal ISRB is activated.

Figure 22:
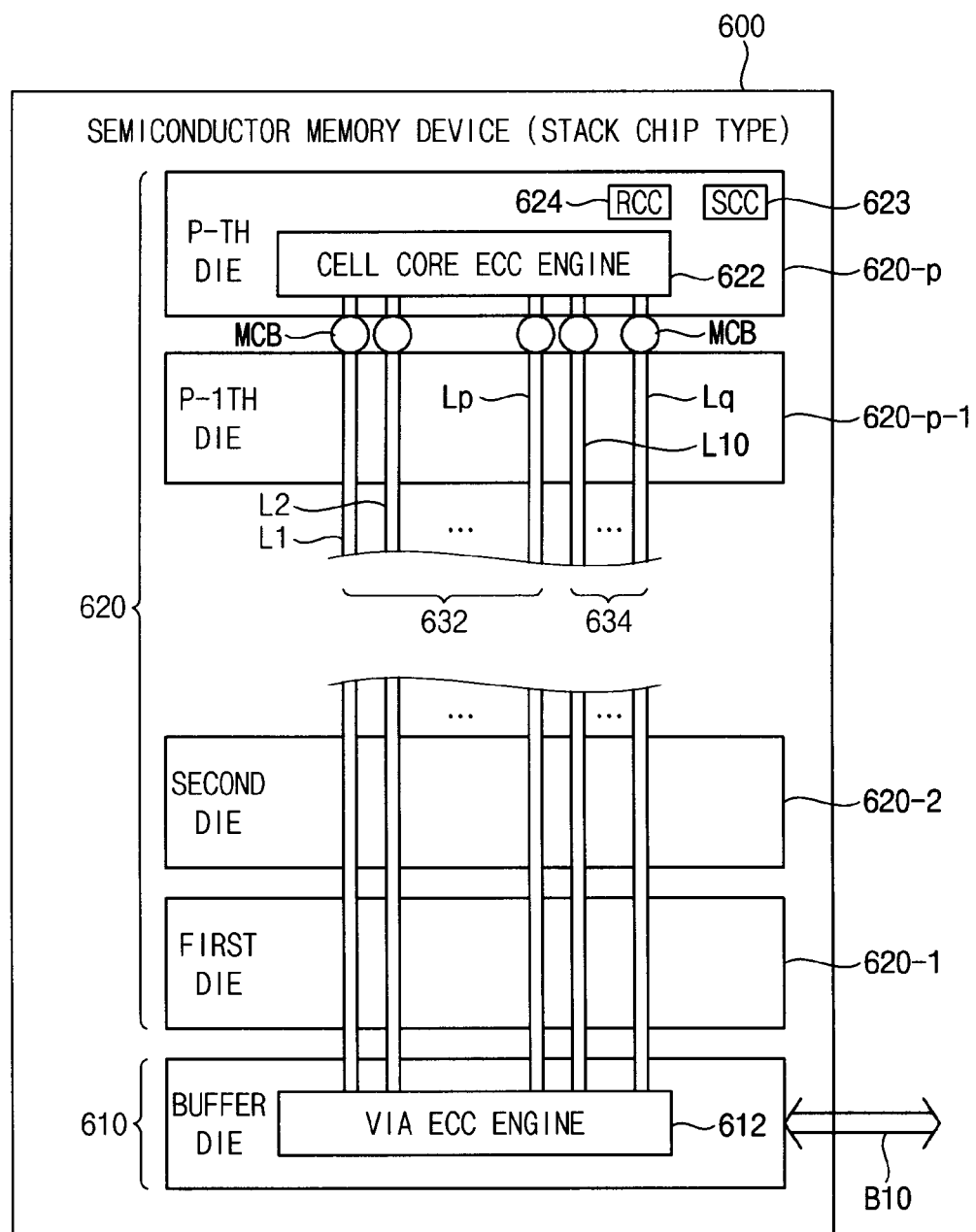
FIG. 22 is a block diagram illustrating a semiconductor memory device according to example embodiments.

FIG. 22 is a block diagram illustrating a semiconductor memory device according to example embodiments.

Referring to FIG. 22, a semiconductor memory device 600 may include a first group of dies 610 and a second group of dies 620 providing a soft error analyzing and correcting function in a stacked chip structure.

The first group of dies 610 may include at least one buffer or logic die. The second group of dies 620 may include a plurality of memory dies 620-1 to 620-p which is stacked on the first group of dies 610 and conveys data through a plurality of through substrate via lines, for example, through silicon via (TSV) lines.

At least one of the memory dies 620-1 to 620-p may include a first type ECC engine 622 which generates transmission parity bits (i.e., transmission parity data) based on transmission data to be sent to the first group of dies 610, a refresh control circuit 624 and a scrubbing control circuit 623. The first type ECC engine 622 may be referred to as 'cell core ECC engine'. The first type ECC engine 622 may employ the ECC engine 400 of FIG. 15. The refresh control circuit 624 may employ the refresh control circuit 385 of FIG. 4. The scrubbing control circuit 623 may employ the scrubbing control circuit 500 of FIG. 10. The first type ECC engine 622 and the scrubbing control circuit 623 may perform scrubbing operation on codewords to prevent error bits from being accumulated while the refresh control circuit 624 does not perform a refresh operation on memory cell rows included in the memory die.

The buffer die 610 may include a second type ECC engine 612 which corrects a transmission error using the transmission parity bits when a transmission error is detected from the transmission data received through the TSV liens and generates error-corrected data. The second type ECC engine 612 may be referred to as 'via ECC engine'.

The semiconductor memory device 600 may be a stack chip type memory device or a stacked memory device which conveys data and control signals through the TSV lines. The TSV lines may be also called 'through electrodes'.

The first type ECC engine 622 may perform error correction on data which is outputted from the memory die 620-p before the transmission data is sent.

A transmission error which occurs at the transmission data may be due to noise which occurs at the TSV lines. Since data fail due to the noise occurring at the TSV lines may be distinguishable from data fail due to a false operation of the memory die, it may be regarded as soft data fail (or a soft error). The soft data fail may be generated due to transmission fail on a transmission path, and may be detected and remedied by an ECC operation.

For example, when the transmission data is 128-bit data, the transmission parity bits may be set to 8 bits. However, the scope and spirit of the inventive concepts are not limited thereto. The number of transmission parity bits increases or decreases.

With the above description, a data TSV line group 632 which is formed at one memory die 620-p may include 128 TSV lines L1 to Lp, and a parity TSV line group 634 may include 8 TSV lines L10 to Lq.

The TSV lines L1 to Lp of the data TSV line group 632 and the parity TSV lines L10 to Lq of the parity TSV line group 634 may be connected to micro bumps MCB which are correspondingly formed among the memory dies 620-1 to 620-p.

At least one of the memory dies 620-1 to 620-p may include DRAM cells each including at least one access transistor and one storage capacitor.

The semiconductor memory device 600 may have a three-dimensional (3D) chip structure or a 2.5D chip structure to communicate with the host through a data bus B10. The buffer die 610 may be connected with the memory controller through the data bus B10.

The first type ECC engine 622, denoted as the cell core ECC engine, may output transmission parity bits as well as the transmission data through the parity TSV line group 634 and the data TSV line group 632 respectively. The outputted transmission data may be data which is error-corrected by the first type ECC engine 622.

The second type ECC engine 612, denoted as the via ECC engine, may determine whether a transmission error occurs at the transmission data received through the data TSV line group 632, based on the transmission parity bits received through the parity TSV line group 634. When a transmission error is detected, the second type ECC engine 612 may correct the transmission error on the transmission data using the transmission parity bits. When the transmission error is uncorrectable, the second type ECC engine 612 may output information indicating occurrence of an uncorrectable data error.

When an error is detected from read data in a high bandwidth memory (HBM) or the stacked memory structure, the error may be an error occurring due to noise while data is transmitted through the TSV.

According to example embodiments, as illustrated in FIG. 22, the cell core ECC engine 622 may be included in each of the memory dies, the via ECC engine 612 may be included in the buffer die. Accordingly, it may be possible to detect and correct soft data fail. The soft data fail may include a transmission error which is generated due to noise when data is transmitted through TSV lines.

Figure 23:
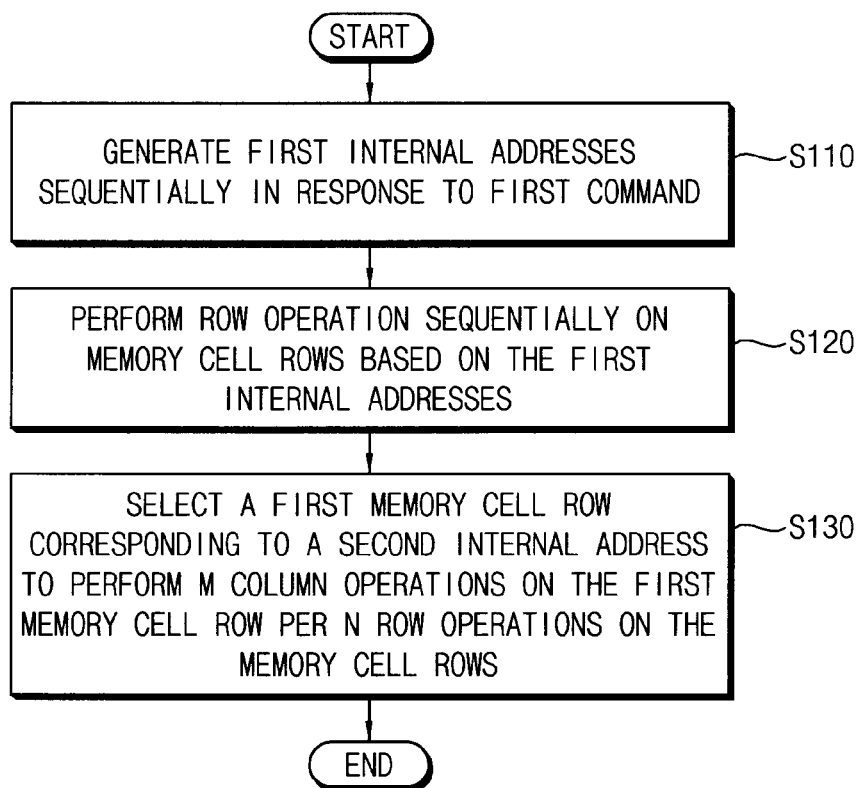
FIG. 23 is a flow chart illustrating a method of a semiconductor memory device according to example embodiments.

FIG. 23 is a flow chart illustrating a method of operating a semiconductor memory device according to example embodiments.

Referring to FIGS. 2 through 23, in a method of operating a semiconductor memory device including a memory cell array 300 which includes a plurality of memory cell rows and each of the plurality of memory cell rows includes a plurality of dynamic memory cells, first internal addresses are sequentially generated in response to a first command received from an external memory controller 100 (S110). The first command may be a refresh command and the first internal addresses may be refresh row address REF_ADDR generated by the refresh control circuit 385.

Row operations are sequentially performed in the memory cell rows based on the first internal addresses (S120). The row operations may be a refresh operation on the memory cell rows. M column operations are performed on a selected memory cell row (S130). Here, M is a natural number equal to or greater than 1. The selected memory cell row is selected from the memory cell rows based on a second internal address which is generated in the semiconductor memory device 200, whenever the row operations are performed N times on the memory cell rows. The second address may be a target scrubbing address generated by the scrubbing control circuit 500 and the M column operations may be scrubbing operations on M codewords.

FIG. 24 shows a 3D chip structure 700 in which a host and an HBM are directly connected without an interposer layer.

Referring to FIG. 24, a host die 710 such as a system-on-chip (SoC), a central processing unit (CPU), or a graphic processing unit (GPU) may be disposed on a printed circuit board (PCB) 720 using flip chip bumps FB. Memory dies D11 to D14 may be stacked on the host die 710 to implement an HBM structure such as the second group of dies 620 in FIG. 22. In FIG. 24, the buffer or logic die 610 of FIG. 22 is omitted. However, the buffer or logic die 610 may be disposed between the memory die D11 and the host die 710. To implement the HBM structure such as the second group of dies 620, TSV lines may be formed in the memory dies D11 and D14. The TSV lines may be electrically connected with micro bumps MCB placed between memory dies.

As mentioned above, according to example embodiments, the semiconductor memory device includes an ECC engine, a scrubbing control circuit and a refresh control circuit. The ECC engine and the scrubbing control circuit perform scrubbing operations one codewords in a memory cell row designated by a scrubbing address provided from the scrubbing control circuit whenever the refresh control circuit performs refresh operation on the memory cell rows N times. In the scrubbing operation, the ECC engine corrects an error bit in a codeword and writes back the corrected codeword in a corresponding memory location. Therefore, the semiconductor memory device may enhance credibility and performance by preventing error bits from being accumulated.

Aspects of the present inventive concept may be applied to systems using semiconductor memory devices that employ an ECC engine. For example, aspects of the present inventive concept may be applied to systems such as be a smart phone, a navigation system, a notebook computer, a desk top computer and a game console that use the semiconductor memory device as a working memory.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims.

What is claimed is:

1. A semiconductor memory device comprising:
a memory cell array including a plurality of memory cell rows, each of the plurality of memory cell rows including memory cells;
an error correction code (ECC) engine;
a refresh control circuit configured to generate refresh row addresses for refreshing a memory region on the memory cell rows in response to a first command received from an external memory controller;
a scrubbing control circuit configured to count the refresh row addresses and generate a scrubbing address for performing a scrubbing operation on at least one sub-page in a first memory cell row of the memory cell rows whenever the scrubbing control circuit counts N refresh row addresses of the refresh row addresses, N being a natural number greater than one, the first memory cell row being selected in response to the scrubbing address; and
a control logic circuit configured to control the ECC engine and the scrubbing control circuit, based on an access address and a command received from the memory controller,
wherein the control logic circuit is configured to control the ECC engine such that the ECC engine reads first data corresponding to a first codeword, from the at least one sub-page in the first memory cell row, corrects at least one error bit in the first codeword, and writes back the corrected first codeword in a memory location in which the first data are stored.

2. The semiconductor memory device of claim 1, wherein the first command is a refresh command.

3. The semiconductor memory device of claim 1, wherein the scrubbing control circuit is configured to sequentially generate scrubbing addresses designating M codewords included in the first memory cell row, M being a natural number equal to or greater than 1.

4. The semiconductor memory device of claim 1, wherein the scrubbing control circuit includes:
a counter configured to count the refresh row addresses to generate an internal scrubbing signal, wherein the counter activates the internal scrubbing signal whenever the counter counts the N refresh row addresses of the refresh row addresses;
a scrubbing address generator configured to generate a normal scrubbing address associated with a normal scrubbing operation for the first memory cell row in a first scrubbing mode, in response to the internal scrubbing signal and a scrubbing mode signal; and
a weak codeword address generator configured to generate a weak codeword address associated with a weak scrubbing operation associated with weak codewords in the first memory cell row in a second scrubbing mode, in response to the internal scrubbing signal and the scrubbing mode signal.

5. The semiconductor memory device of claim 4,
wherein the normal scrubbing address includes a scrubbing row address designating one memory cell row and a scrubbing column address designating one of codewords included in the one memory cell row, and
wherein the scrubbing address generator includes:
a page segment counter configured to increase the scrubbing column address by one during the internal scrubbing signal is activated in the first scrubbing mode; and
a row counter configured to increase the scrubbing row address by one whenever the scrubbing column address reaches a maximum value.

6. The semiconductor memory device of claim 4, wherein the weak codeword address generator includes:
an address storing table configured to store address information of the weak codewords; and
a table pointer configured to generate a pointer signal that provides location information of the address storing table in response to the internal scrubbing signal.

7. The semiconductor memory device of claim 6, wherein the address storing table is configured to output a row address and a column address of a weak codeword as a weak codeword row address and a weak codeword column address, which are stored in a corresponding location of the address storing table whenever the pointer signal is applied to the address storing table in the second scrubbing mode, in response to the internal scrubbing signal.

8. The semiconductor memory device of claim 1, wherein the control logic circuit is configured to control the ECC engine such that the ECC engine reads data corresponding to a second codeword, from at least one sub-page in a memory cell row designated by the access address, corrects at least one error bit in the second codeword and transmits the corrected second codeword to the memory controller, in response to a read command received from the memory controller.

9. The semiconductor memory device of claim 8, wherein:
the ECC engine is configured to provide an error generation signal to the control logic circuit when the ECC engine detects at least one error bit in the second codeword;
the control logic circuit is configured to provide an address of the second codeword to the scrubbing control circuit as an error address; and
the scrubbing control circuit is configured to store the error address in an address storing table therein as a weak codeword address.

10. The semiconductor memory device of claim 9, wherein the control logic circuit is configured to provide an address of the memory cell row to the scrubbing control circuit as the error address when the ECC engine generates the error generation signal for the memory cell row more than a reference number of times.

11. The semiconductor memory device of claim 1, wherein the scrubbing control circuit includes a counter configured to count the refresh row addresses to generate an internal scrubbing signal whenever the counter counts the N refresh row addresses of the refresh row addresses, and
wherein the refresh control circuit is configured to stop generating the refresh row addresses in response to the internal scrubbing signal.

12. The semiconductor memory device of claim 1, further comprising:
a victim address detector configured to count a number of accesses to a first memory region in the memory cell array to generate at least one victim address designating at least one adjacent memory region adjacent to the first memory region when the number of the counted accesses reaches a threshold value during a reference interval.

13. The semiconductor memory device of claim 12, wherein:
the victim address detector is configured to provide the at least one victim address to the scrubbing control circuit; and
the scrubbing control circuit is configured to store the at least one victim address in an address storing table therein as a weak codeword address.

14. The semiconductor memory device of claim 12, wherein:
the victim address detector is configured to provide the at least one victim address to a row decoder coupled to the memory cell array; and
the row decoder is configured to refresh the at least one adjacent memory region at least two times while the row decoder refreshes the memory region on the memory cell rows once in response to the refresh row addresses and the at least one victim address.

15. The semiconductor memory device of claim 1, comprising:
a first group of dies including at least one buffer die; and
a second group of dies including a plurality of memory dies, the plurality of memory dies stacked on the at least one buffer die and conveying data through a plurality of through silicon via (TSV) lines,
wherein at least one of the plurality of memory dies includes the memory cell array, the ECC engine, the refresh control circuit and the scrubbing control circuit, and the ECC engine is configured to generate transmission parity bits using a transmission data to be sent to the at least one buffer die, and
wherein the at least one buffer die includes a via ECC engine configured to correct a transmission error using the transmission parity bits when a transmission error is detected from the transmission data received through the plurality of TSV lines.

16. A memory system comprising:
a semiconductor memory device; and
a memory controller configured to control the semiconductor memory device, wherein the semiconductor memory device comprises:
a memory cell array including a plurality of memory cell rows, each of the plurality of memory cell rows including memory cells;
an error correction code (ECC) engine;
a refresh control circuit configured to generate refresh row addresses for refreshing a memory region on the memory cell rows in response to a first command received from the memory controller;
a scrubbing control circuit configured to count the refresh row addresses and generate a scrubbing address for performing a scrubbing operation on at least one sub-page in a first memory cell row of the memory cell rows whenever the scrubbing control circuit counts N refresh row addresses of the refresh row addresses, N being a natural number greater than one, the first memory cell row being selected in response to the scrubbing address; and
a control logic circuit configured to control the ECC engine and the scrubbing control circuit, based on an access address and a command received from the memory controller,
wherein the control logic circuit is configured to control the ECC engine such that the ECC engine reads first data corresponding to a first codeword, from the at least one sub-page in the first memory cell row, corrects at least one error bit in the first codeword, and writes back the corrected first codeword in a memory location in which the first data are stored.

17. The memory system of claim 16, wherein:
the first command is a refresh command; and
the scrubbing control circuit is configured to sequentially generate scrubbing addresses designating M codewords included in the first memory cell row, M being a natural number equal to or greater than one.

18. A method of operating a semiconductor memory device including a memory cell array that includes a plurality of memory cell rows, each of the plurality of memory cell rows including a plurality of memory cells, the method comprising:
generating first internal addresses sequentially in response to a first command received from an external memory controller;
performing row operations sequentially on the memory cell rows based on the first internal addresses; and
performing M column operations on a first memory cell row from the memory cell rows,
wherein the first memory cell row is selected based on a second internal address which is generated in the semiconductor memory device, whenever the row operations are performed N times on the memory cell rows, and
wherein N is a natural number greater than one and M is a natural number equal to or greater than one.

19. The method of claim 18, wherein:
the row operations are refresh operations on the memory cell rows;
the M column operations are scrubbing operations which are sequentially performed on M codewords included in the first memory cell row; and
an error correction code (ECC) engine included in the semiconductor memory device is configured to perform the scrubbing operations by reading each of the M codewords, correcting at least one error bit in each of the M codewords, and writing back corrected each codeword in a memory location stored a corresponding each codeword.

20. The method of claim 19, wherein no refresh operation is performed while the scrubbing operations are performed.

* * * * *